US012754477B2

(12) United States Patent
Lee et al.

(10) Patent No.: US 12,754,477 B2
(45) Date of Patent: Oct. 6, 2026

(54) PHOTOSENSITIVE COMPOSITION FOR FORMING LIGHT BLOCKING LAYER OF ORGANIC LIGHT EMITTING DEVICE

(71) Applicant: DUK SAN NEOLUX CO., LTD., Cheonan-si (KR)

(72) Inventors: Changmin Lee, Cheonan-si (KR); Yun Jong Ko, Cheonan-si (KR); Hyunsang Cho, Cheonan-si (KR); Jaehyun Lim, Cheonan-si (KR); Hye Jung Choi, Cheonan-si (KR); Yeon Soo Lee, Cheonan-si (KR); Nam Kyun Kim, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 661 days.

(21) Appl. No.: 18/133,770

(22) Filed: Apr. 12, 2023

(65) Prior Publication Data

US 2023/0324792 A1 Oct. 12, 2023

(30) Foreign Application Priority Data

Apr. 12, 2022 (KR) ........................ 10-2022-0045425

(51) Int. Cl.

*G03F 7/029* (2006.01)
*C01B 33/12* (2006.01)
*G03F 7/00* (2006.01)
*G03F 7/032* (2006.01)
*H10K 59/122* (2023.01)

(Continued)

(52) U.S. Cl.

CPC .............. *G03F 7/029* (2013.01); *C01B 33/12* (2013.01); *G03F 7/0007* (2013.01); *G03F 7/032* (2013.01); *H10K 59/122* (2023.02); *H10K 59/124* (2023.02); *H10K 59/126* (2023.02); *C01P 2004/64* (2013.01); *C01P 2004/90* (2013.01)

(58) Field of Classification Search

CPC .......... G03F 7/004; G03F 7/028; G03F 7/032; H10K 59/122

See application file for complete search history.

(56) References Cited

U.S. PATENT DOCUMENTS

2012/0003436 A1* 1/2012 Saie ...................... G03F 7/0007 430/323
2020/0241415 A1* 7/2020 Lee ...................... C08G 59/245

FOREIGN PATENT DOCUMENTS

| | | | |
|---|---|---|---|
| KR | 10-2012-0002484 | A | 1/2012 |
| KR | 10-2022-0010122 | A | 1/2022 |
| WO | 2021/059860 | A1 | 4/2021 |

* cited by examiner

*Primary Examiner* — Mark F. Huff
*Assistant Examiner* — Anna Malloy
(74) *Attorney, Agent, or Firm* — Vorys, Sater, Seymour and Pease LLP; Mih Suhn Koh

(57) ABSTRACT

Provided are a photosensitive composition for forming a light shielding layer of an organic light emitting display device, which includes (A) an alkali soluble resin including a repeating unit represented by Formula (1); (B) a reactive unsaturated compound; (C) a photoinitiator; (D) a black colorant; (E) a hollow silica particle; and (F) a solvent, a light shielding layer of an organic light emitting display device including the composition with excellent resolution while simultaneously implementing light shielding properties and low reflection properties, an organic light emitting display device including the light shielding layer, and an electronic device including the organic light emitting display device.

19 Claims, 1 Drawing Sheet

(51) Int. Cl.
*H10K 59/124* (2023.01)
*H10K 59/126* (2023.01)

PHOTOSENSITIVE COMPOSITION FOR FORMING LIGHT BLOCKING LAYER OF ORGANIC LIGHT EMITTING DEVICE

TECHNICAL FIELD

The present disclosure relates to a photosensitive composition for forming a light shielding layer of an organic light emitting display device, and an organic light emitting display device to which the photosensitive composition for forming a light shielding layer is applied.

BACKGROUND

As a display device, a liquid crystal display device (LCD), an organic light emitting display device (OLED), etc. are widely used. In particular, the organic light emitting display device has advantages such as low power consumption, a fast response speed, high color reproducibility, high luminance, and a wide viewing angle.

A black photosensitive resin composition is an essential material for preparing display elements such as color filters, liquid crystal display materials, organic light emitting elements (EL), and display panel materials. For example, in color filters (e.g., color liquid crystal displays, etc.), in order to enhance display contrast or color development, a black matrix or light shielding partition is necessary at the boundary between colored layers such as red, green, and blue, and this is mainly formed of a black photosensitive resin composition.

In particular, the recent development direction of OLED displays is focused on higher luminance and a higher color reproduction rate. That is, attempts have been made to achieve high luminance and a high color reproduction rate by reducing the reflectance of light coming from outdoors; therefore, efforts to reduce the reflectance of black matrices or light shielding partitions have been continued. Additionally, as the resolution (8 k) increases, the requirement for implementing fine black matrix patterns is also increasing.

The method mainly under development in order to reduce the reflectance of the display is a method of applying an anti-reflective (AR) film and an anti-glare (AG) film, which are antireflection films of a polarizing film.

However, such a method has now reached a limit, and efforts to reduce the reflectance by other methods are underway.

BRIEF DESCRIPTION OF INVENTION

Technical Problem

In order to solve the conventional problems in the art, an object of the present invention is to provide a photosensitive composition with excellent resolution while simultaneously implementing light shielding properties and low reflection properties.

Another object of the present disclosure is to provide a light shielding layer of an organic light emitting display device prepared using the photosensitive composition.

Still another object of the present disclosure is to provide an organic light emitting display device including the light shielding layer.

Still another object of the present disclosure is to provide an electronic device including the organic light emitting display device.

Technical Solution

The photosensitive composition for forming a light shielding layer of an organic light emitting display device according to the present disclosure preferably includes:

(1) an alkali soluble resin including a repeating unit represented by the following Formula (1);

(2) a reactive unsaturated compound;

(3) a photoinitiator;

(4) a black colorant;

(5) a hollow silica particle; and (6) a solvent.

Formula (1)

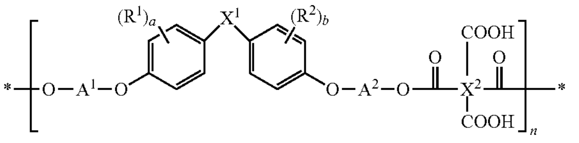

wherein in Formula (1) above,

1) * represents a part where a bond is connected by a repeating unit, 2) n is an integer from 2 to 200,000, 3) $R^1$ and $R^2$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 4) $R^1$ and $R^2$ are each able to form a ring with a neighboring group, 5) a and b are each independently an integer of 0 to 4, 6) $X^1$ is a single bond, O, CO, $SO_2$, CR'R", SiR'R", Formula (a), or Formula (b), 6-1) R' and R" are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-2) R' and R" are each able to form a ring with a neighboring group, Formula (a)

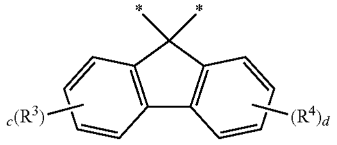

Formula (b)

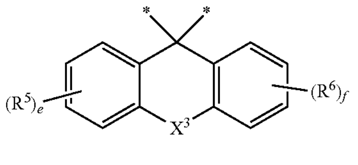

wherein in Formula (a) and Formula (b) above, 6-3-1) * represents a binding site, 6-3-2) $X_3$ is O, S, $SO_2$, or NR', 6-3-3) R' and $R^3$ to $R^6$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-3-4) $R^3$ to $R^6$ are each able to form a ring with a neighboring group, 6-3-5) c to f are each independently an integer of 0 to 4, 7) $X^2$ is a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8) $A^1$ and $A^2$ are each independently Formula (c) or Formula (d), Formula (c)

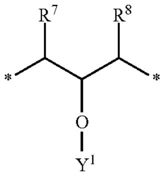

Formula (d)

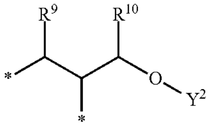

wherein in Formula (c) and Formula (d) above, 8-1) * represents a binding site, 8-2) $R^7$ to $R^{10}$* are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3) the ratio of Formula (c) and Formula (d) in the polymer chain of the resin including a repeating unit represented by Formula (1) above is 1:9 to 9:1, 8-4) $Y^1$ and $Y^2$ are each independently Formula (e) or Formula (f), Formula (e)

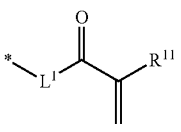

-continued

Formula (f)

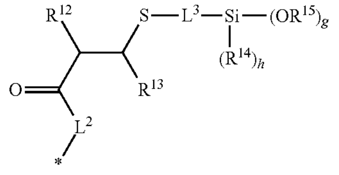

wherein in Formula (e) or Formula (f), 8-4-1) * represents a binding site, 8-4-2) $R^{11}$ is hydrogen or methyl, 8-4-3) $R^{12}$ to $R^{15}$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-4-4) $L^1$ to $L^3$ are each independently a single bond; a fluorenylene group; $C_{2-30}$ alkylene; $C_{6-30}$ arylene; a $C_{2-30}$ heterocyclic ring; $C_{1-30}$ alkoxylene, $C_{2-30}$ alkyleneoxy; $C_{6-30}$ aryloxy; or $C_{2-30}$ polyethyleneoxy, 8-4-5) g and h are each independently an integer from 0 to 3; with the proviso that g+h=3, and 9) the R', R", $X^2$, $L^1$ to $L^3$, $R^1$ to $R^{10}$, and $R^{12}$ to $R^{15}$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

The size of the hollow silica particle is preferably from 30 nm to 450 nm.

In the photosensitive composition, the hollow silica particles are preferably included in an amount of 0.1 wt % to 20 wt % based on the solid content excluding the solvent.

The refractive index of the hollow silica particle is preferably 1.10 to 1.41.

The porosity of the hollow silica particle is preferably 20 vol % to 95 vol %.

The sphericity of the hollow silica particle is preferably 1.05 to 1.5.

The specific surface area of the hollow silica particle is preferably 10 $m^2/g$ to 2,000 $m^2/g$.

The weight average molecular weight of the alkali soluble resin is preferably 1,000 to 100,000.

The alkali soluble resin is preferably included in an amount of 1 wt % to 50 wt % based on the total amount of the photosensitive composition.

The reactive unsaturated compound is preferably included in an amount of 1 wt % to 50 wt % based on the total amount of the photosensitive composition.

The photoinitiator is preferably included in an amount of 0.01 wt % to 10 wt % based on the total amount of the photosensitive composition.

The colorant preferably includes at least one of inorganic pigments and organic pigments.

The colorant is preferably included in an amount of 1 wt % to 40 wt % based on the total amount of the photosensitive composition.

The colorant is preferably pretreated using a dispersant; or a water-soluble inorganic salt and a wetting agent.

The average particle diameter of the colorant is preferably 5 nm to 200 nm.

In another specific embodiment, the present disclosure provides a light shielding layer formed of the photosensitive composition.

In still another specific embodiment, the present disclosure provides an organic light emitting display device including the light shielding layer.

The light shielding layer is preferably one or more selected from the group consisting of a flattening layer, a pixel defining layer, and a color separation unit.

In still another specific embodiment, the present disclosure provides an electronic device including the display device and a control unit for driving the display device.

Effects of the Invention

The photosensitive composition of the present disclosure for forming a light shielding layer of an organic light emitting display device, which includes (A) an alkali soluble resin including a repeating unit represented by Formula (1); (B) a reactive unsaturated compound; (C) a photoinitiator; (D) a black colorant; (E) a hollow silica particle; and (F) a solvent; and a light shielding layer of an organic light emitting display device with excellent resolution while simultaneously implementing light shielding properties and low reflection properties, an organic light emitting display device including the light shielding layer, and an electronic device including the organic light emitting display device can be provided.

CODE EXPLANATION

Figure 1:
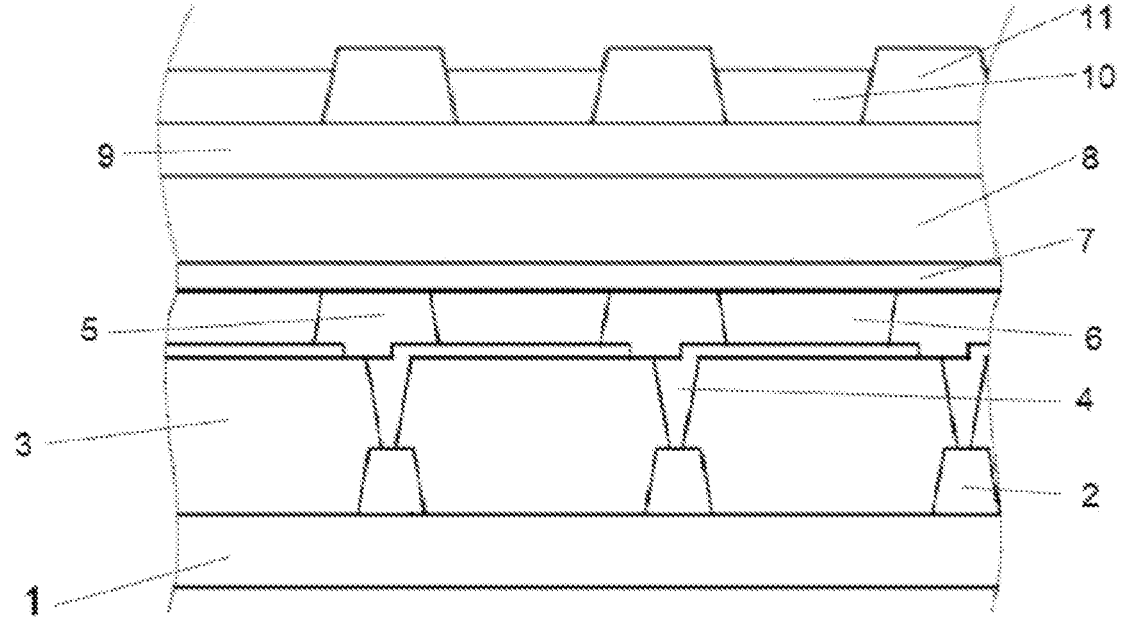
FIG. 1 conceptually illustrates a display device for implementing the present disclosure.
Figure 2:
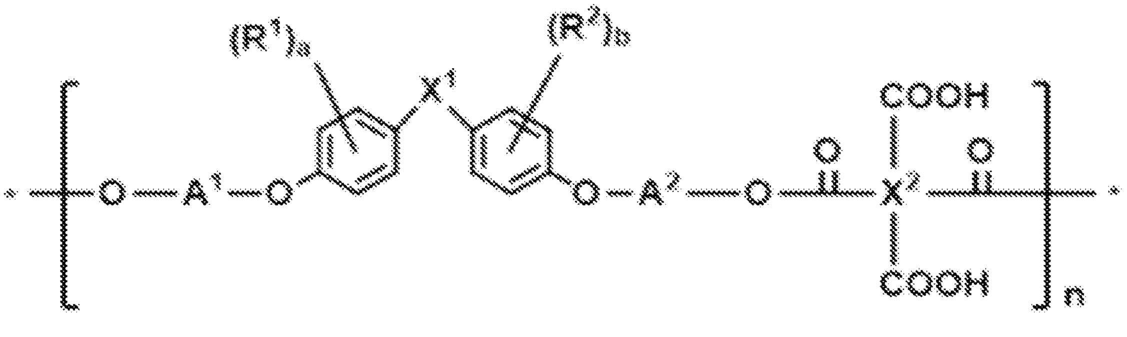
FIG. 2 representatively illustrates Formula (1) according to the present disclosure.

| | |
|---|---|
| 1: substrate | 2: TFT layer |
| 3: flattening layer | 4: pixel electrode |
| 5: pixel defining layer | 6: organic material layer |
| 7: counter electrode | 8: sealing layer |
| 9: touch panel | 10: color unit |
| 11: color separation unit | |

DETAILED DESCRIPTION OF THE INVENTION

Hereinafter, some embodiments of the present disclosure will be described in detail with reference to exemplary drawings. In adding reference numerals to components of each drawing, the same components may have the same reference numerals even though they are indicated in different drawings.

When it is determined that a detailed description of a related known constitution or function may obscure the gist of the present disclosure in describing the present disclosure, the detailed description thereof may be omitted. When the expressions "includes", "has", "consisting of", etc. mentioned in this specification are used, other parts may be added unless "only" is used. When a component is expressed in the singular form, it may include a case in which the plural form is included unless otherwise explicitly stated.

Additionally, in describing the components of the present disclosure, terms such as first, second, A, B, (a), (b), etc. may be used. These terms are only for distinguishing the components from other components, and the essence, order, sequence, the number, etc. of the components are not limited by the terms.

In the description of the positional relationship of the components, when two or more components are described as being "connected", "linked", or "fused", etc., the two or more components may be directly "connected", "linked", or "fused", but it should be understood that the two or more components may also be "connected", "linked", or "fused" by way of a further "interposition" of a different component. In particular, the different component may be included in any one or more of the two or more components that are to be "connected", "linked", or "fused" to each other.

Additionally, when a component (e.g., a layer, a film, a region, a plate, etc.) is described to be "on top" or "on" of another component, it should be understood that this may also include a case where another component is "immediately on top of" as well as a case where another component is disposed therebetween. In contrast, it should be understood that when a component is described to be "immediately on top of" another component, it should be understood that there is no other component disposed therebetween.

In the description of the temporal flow relationship related to the components, the operation method, or the production method, for example, when the temporal precedence or flow precedence is described by way of "after", "subsequently", "thereafter", "before", etc., it may also include cases where the flow is not continuous unless terms such as "immediately" or "directly" are used.

Meanwhile, when the reference is made to numerical values or corresponding information for components, numerical values or corresponding information may be interpreted as including an error range that may occur due to various factors (e.g., procedural factors, internal or external shocks, noise, etc.) even if it is it not explicitly stated.

The terms used in this specification and the appended claims are as follows, unless otherwise stated, without departing from the spirit of the present disclosure.

As used herein, the term "halo" or "halogen" includes fluorine (F), chlorine (Cl), bromine (Br), and iodine (I), unless otherwise specified.

As used herein, the term "alkyl" or "alkyl group" refers to a radical having 1 to 60 carbons linked by a single bond unless otherwise specified, and refers to a radical of a saturated aliphatic functional group, including a linear chain alkyl group, a branched chain alkyl group, a cycloalkyl (alicyclic) group, an alkyl-substituted cycloalkyl group, and a cycloalkyl-substituted alkyl group.

As used herein, the term "haloalkyl group" or "halogenalkyl group" refers to an alkyl group in which a halogen is substituted, unless otherwise specified.

As used herein, the term "alkenyl" or "alkynyl" refers to a group having a double bond or a triple bond, respectively, includes a linear or branched chain group, and has 2 to 60 carbon atoms, unless otherwise specified, but is not limited thereto.

As used herein, the term "cycloalkyl" refers to an alkyl which forms a ring having 3 to 60 carbon atoms unless otherwise specified, but is not limited thereto.

As used herein, the term "an alkoxy group" or "alkyloxy group" refers to an alkyl group to which an oxygen radical is linked, and has 1 to 60 carbon atoms unless otherwise specified, but is not limited thereto.

As used herein, the term "alkenoxyl group", "alkenoxy group", "alkenyloxyl group", or "alkenyloxy group" refers to an alkenyl group to which an oxygen radical is linked, and has 2 to 60 carbon atoms unless otherwise specified, but is not limited thereto.

As used herein, the terms "aryl group" and "arylene group" refer to a group each having 6 to 60 carbon atoms unless otherwise specified, but are not limited thereto. As used herein, the aryl group or arylene group includes a single ring type, a ring assembly, a fused multiple ring compound, etc. For example, the aryl group may include a phenyl group, a monovalent functional group of biphenyl, a monovalent functional group of naphthalene, a fluorenyl group, and a substituted fluorenyl group, and the arylene group may include a fluorenylene group and a substituted fluorenylene group.

As used herein, the term "ring assembly" means that two or more ring systems (monocyclic or fused ring systems) are directly connected to each other through a single bond or double bond, in which the number of direct links between such rings is one less than the total number of ring systems in the compound. In the ring assembly, the same or different ring systems may be directly connected to each other through a single bond or double bond.

As used herein, since the aryl group includes a ring assembly, the aryl group includes biphenyl and terphenyl in which a benzene ring, which is a single aromatic ring, is connected by a single bond. Additionally, since the aryl group also includes a compound in which an aromatic ring system fused to an aromatic single ring is connected by a single bond, it also includes, for example, a compound in which a benzene ring (which is a single aromatic ring) and fluorine (which is a fused aromatic ring system) are linked by a single bond.

As used herein, the term "fused multiple ring system" refers to a fused ring form in which at least two atoms are shared, and it includes a form in which ring systems of two or more hydrocarbons are fused, a form in which at least one heterocyclic system including at least one heteroatom is fused, etc. Such a fused multiple ring system may be an aromatic ring, a heteroaromatic ring, an aliphatic ring, or a combination of these rings. For example, in the case of an aryl group, it may be a naphthalenyl group, a phenanthrenyl group, a fluorenyl group, etc., but is not limited thereto.

As used herein, the term "a spiro compound" has a spiro union, and the spiro union refers to a linkage in which two rings share only one atom. In particular, the atom shared by the two rings is called a "spiro atom", and they are each called "monospiro-", "dispiro-", and "trispiro-" compounds depending on the number of spiro atoms included in a compound.

As used herein, the terms "fluorenyl group", "fluorenylene group", and "fluorenetriyl group" refer to a monovalent, divalent, or trivalent functional group in which R, R', R", and R'" are all hydrogen in the following structures, respectively, unless otherwise specified; "substituted fluorenyl group", "substituted fluorenylene group", or "substituted fluorenetriyl group" means that at least one of the substituents R, R', R", and R'" is a substituent other than hydrogen, and includes cases where R and R' are bound to each other to form a spiro compound together with the carbon to which they are linked. As used herein, all of the fluorenyl group, the fluorenylene group, and the fluorenetriyl group may also be referred to as a fluorene group regardless of valences such as monovalent, divalent, trivalent, etc.

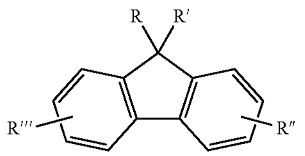

Additionally, the R, R', R", and R'" may each independently be an alkyl group having 1 to 20 carbon atoms, an alkenyl group having 1 to 20 carbon atoms, an aryl group having 6 to 30 carbon atoms, and a heterocyclic group having 2 to 30 carbon atoms and, for example, the aryl group may be phenyl, biphenyl, naphthalene, anthracene, or phenanthrene, and the heterocyclic group may be pyrrole, furan, thiophene, pyrazole, imidazole, triazole, pyridine, pyrimidine, pyridazine, pyrazine, triazine, indole, benzofuran, quinazoline, or quinoxaline. For example, the substituted fluorenyl group and the fluorenylene group may each be a monovalent functional group or divalent functional group of 9,9-dimethylfluorene, 9,9-diphenylfluorene and 9,9'-spirobi[9H-fluorene].

As used herein, the term "heterocyclic group" includes not only aromatic rings (e.g., "heteroaryl group" and "heteroarylene group"), but also non-aromatic rings, and may refer to a ring having 2 to 60 carbon atoms each including one or more heteroatoms unless otherwise specified, but is not limited thereto. As used herein, the term "heteroatom" refers to N, O, S, P, or Si unless otherwise specified, and a heterocyclic group refers to a monocyclic group including a heteroatom, a ring assembly, a fused multiple ring system, a spiro compound, etc.

For example, the "heterocyclic group" may include a compound including a heteroatom group (e.g., $SO_2$, P═O, etc.), such as the compound shown below, instead of carbon that forms a ring.

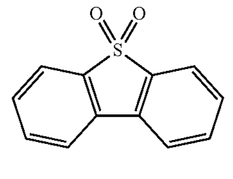 [SMILES: O=S1(=O)c2ccccc2-c2ccccc21]

As used herein, the term "ring" includes monocyclic and polycyclic rings, and includes heterocycles containing at least one heteroatom as well as hydrocarbon rings, and includes aromatic and non-aromatic rings.

As used herein, the term "polycyclic" includes ring assemblies (e.g., biphenyl, terphenyl, etc.), fused multiple ring systems, and spiro compounds, includes non-aromatic as well as aromatic compounds, and includes heterocycles containing at least one heteroatom as well as hydrocarbon rings.

As used herein, the term "alicyclic group" refers to cyclic hydrocarbons other than aromatic hydrocarbons, and it includes monocyclic, ring assemblies, fused multiple ring systems, spiro compounds, etc., and refers to a ring having 3 to 60 carbon atoms unless otherwise specified, but is not limited thereto. For example, when benzene (i.e., an aromatic ring) and cyclohexane (i.e., a non-aromatic ring) are fused, it also corresponds to an aliphatic ring.

Additionally, when prefixes are named consecutively, it means that the substituents are listed in the order they are described. For example, in the case of an arylalkoxy group, it means an alkoxy group substituted with an aryl group; in the case of an alkoxycarbonyl group, it means a carbonyl group substituted with an alkoxy group; additionally, in the case of an arylcarbonyl alkenyl group, it means an alkenyl group substituted with an arylcarbonyl group, in which the arylcarbonyl group is a carbonyl group substituted with an aryl group.

Additionally, unless otherwise specified, the term "substituted" in the expression "substituted or unsubstituted" as used herein refers to a substitution with one or more substituents selected from the group consisting of deuterium, a halogen, an amino group, a nitrile group, a nitro group, a $C_{1-30}$ alkyl group, a $C_{1-30}$ alkoxy group, a $C_{1-30}$ alkylamine group, $C_{1-30}$ alkylthiophene group, a $C_{6-30}$ arylthiophene group, a $C_{2-30}$ alkenyl group, a $C_{2-30}$ alkynyl group, a $C_{3-30}$ cycloalkyl group, a $C_{6-30}$ aryl group, a $C_{6-30}$ aryl group substituted with deuterium, a $C_{8-30}$ arylalkenyl group, a silane group, a boron group, a germanium group, and a $C_{2-20}$ heterocyclic group containing at least one heteroatom selected from the group consisting of O, N, S, Si, and P, but is not limited to these substituents.

As used herein, the "names of functional groups" corresponding to the aryl group, arylene group, heterocyclic group, etc. exemplified as examples of each symbol and a substituent thereof may be described as "a name of the functional group reflecting its valence", and may also be described as the "name of its parent compound". For example, in the case of "phenanthrene", which is a type of an aryl group, the names of the groups may be described such that the monovalent group is described as "phenanthryl (group)", and the divalent group is described as "phenanthrylene (group)", etc., but may also be described as "phenanthrene", which is the name of its parent compound, regardless of its valence.

Similarly, in the case of pyrimidine as well, it may be described regardless of its valence, or in the case of being monovalent, it may be described as pyrimidinyl (group); and in the case of being divalent, it may be described as the "name of the group" of the valence (e.g., pyrimidinylene (group)). Therefore, as used herein, when the type of a substituent is described as the name of its parent compound, it may refer to an n-valent "group" formed by detachment of a hydrogen atom linked to a carbon atom and/or hetero atom of its parent compound.

Additionally, in describing the names of the compounds or the substituents in the present specification, the numbers, letters, etc. indicating positions may be omitted. For example, pyrido[4,3-d]pyrimidine may be described as pyridopyrimidine; benzofuro[2,3-d]pyrimidine as benzofuropyrimidine; 9,9-dimethyl-9H-fluorene as dimethylfluorene, etc. Therefore, both benzo[g]quinoxaline and benzo[f]quinoxaline may be described as benzoquinoxaline.

Additionally, unless there is an explicit description, the formulas used in the present disclosure are applied in the same manner as in the definition of substituents by the exponent definition of the formula below.

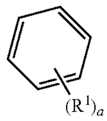

In particular, when a is an integer of 0, it means that the substituent $R^1$ is absent, that is, when a is 0, it means that all hydrogens are linked to carbons that form a benzene ring, and in this case, the formula or compound may be described while omitting the indication of the hydrogen linked to the carbon. Additionally, when a is an integer of 1, one substituent $R^1$ may be linked to any one of the carbons forming a benzene ring; when a is an integer of 2 or 3, it may be linked, for example, as shown below; even when a is an integer of 4 to 6, it may be linked to the carbon of a benzene ring in a similar manner; and when a is an integer of 2 or greater, $R^1$ may be the same as or different from each other.

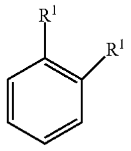

(a=2)

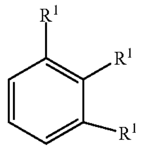

(a=3)

Unless otherwise specified in the present application, forming a ring means that neighboring groups bind to one another to form a single ring or fused multiple ring, and the single ring and the formed fused multiple ring include a heterocycle containing at least one heteroatom as well as a hydrocarbon ring, and may include aromatic and non-aromatic rings.

Additionally, unless otherwise specified in the present specification, when indicating a condensed ring, the number in "number-condensed ring" indicates the number of rings to be condensed. For example, a form in which three rings are condensed with one another (e.g., anthracene, phenanthrene, benzoquinazoline, etc.) may be expressed as a 3-condensed ring.

Meanwhile, as used herein, the term "bridged bicyclic compound" refers to a compound in which two rings share 3 or more atoms to form a ring, unless otherwise specified. In particular, the shared atoms may include carbon or a hetero atom.

In the present disclosure, an organic electric device may refer to a component(s) between an anode and a cathode, or may refer to an organic light emitting diode which includes an anode, a cathode, and a component(s) disposed therebetween.

Additionally, in some cases, the display device in the present disclosure may refer to an organic electric device, an organic light emitting diode, and a panel including the same, or may refer to an electronic device including a panel and a circuit. In particular, for example, the electronic device may include a lighting device, a solar cell, a portable or mobile terminal (e.g., a smart phone, a tablet, a PDA, an electronic dictionary, a PMP, etc.), a navigation terminal, a game machine, various TV sets, various computer monitors, etc., but is not limited thereto, and may be any type of device as long as it includes the component(s).

Hereinafter, embodiments of the present disclosure will be described in detail. However, these embodiments are provided for illustrative purposes, and the present disclosure is not limited thereby, and the present disclosure is only defined by the scope of the claims to be described later.

The photosensitive composition for forming a light shielding layer of an organic light emitting display device according to an embodiment of the present disclosure includes an alkali soluble resin, a reactive unsaturated compound, photoinitiator, a black colorant, a hollow silica particle, and a solvent.

Hereinafter, each component will be described in detail.

(1) Alkali Soluble Resin

The photosensitive composition for forming a light shielding layer of an organic light emitting display device includes a repeating unit with the structure of the following Formula (1).

Formula (1)

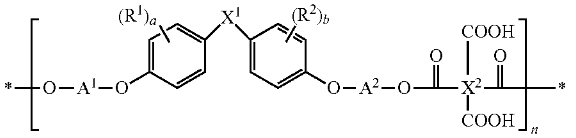

wherein in Formula (1) above,

1) * represents a part where a bond is connected by a repeating unit, 2) n is an integer from 2 to 200,000, 3) $R^1$ and $R^2$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 4) $R^1$ and $R^2$ are each able to form a ring with a neighboring group, 5) a and b are each independently an integer of 0 to 4, 6) $X^1$ is a single bond, O, CO, $SO_2$, CR'R", SiR'R", Formula (a), or Formula (b), 6-1) R' and R" are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-2) R' and R" are each able to form a ring with a neighboring group, and embodiments thereof are as follows.

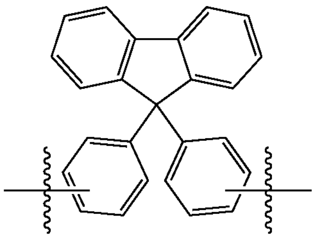

-continued

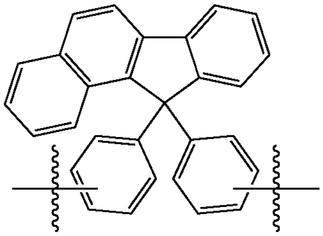

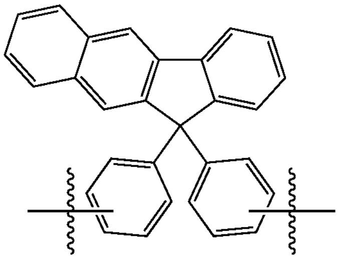

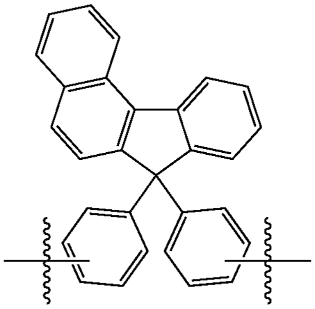

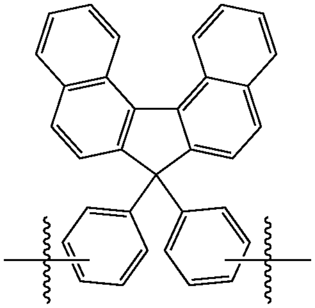

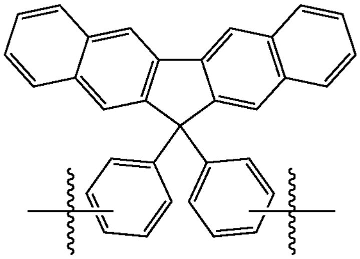

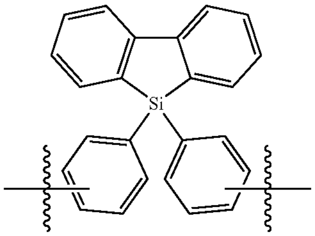

-continued

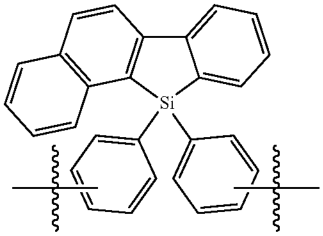

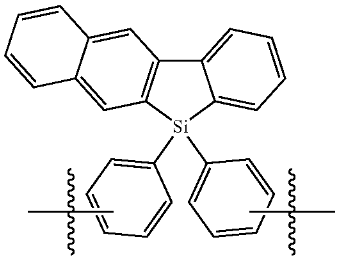

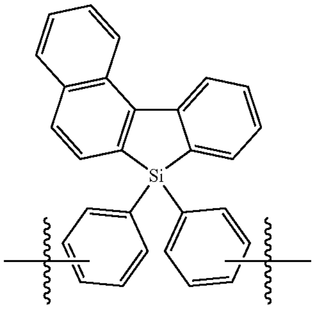

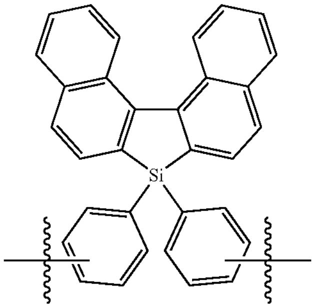

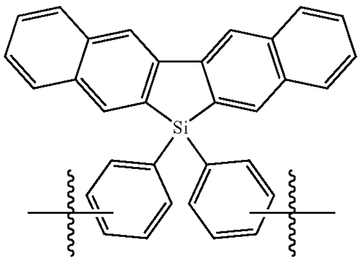

Formula (a) and Formula (b) above are as follows.

Formula (a)

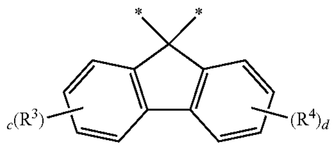

-continued

Formula (b)

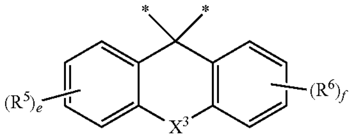

wherein in Formula (a) and Formula (b) above, 6-3-1) * represents a binding site, 6-3-2) $X_3$ is O, S, $SO_2$, or NR', 6-3-3) R' and $R^3$ to $R^6$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-3-4) $R^3$ to $R^6$ are each able to form a ring with a neighboring group, 6-3-5) c to f are each independently an integer of 0 to 4, 7) $X^2$ is a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8) $A^1$ and $A^2$ are each independently Formula (c) or Formula (d), Formula (c)

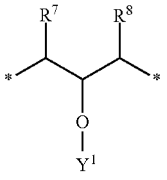

Formula (d)

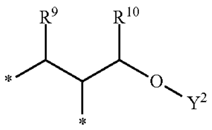

wherein in Formula (c) and Formula (d) above, 8-1) * represents a binding site, 8-2) $R^7$ to $R^{10}$* are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3) the ratio of Formula (c) and Formula (d) in the polymer chain of the resin including a repeating unit represented by Formula (1) above is 1:9 to 9:1, 8-4) $Y^1$ and $Y^2$ are each independently Formula (e) or Formula (f), Formula (e)

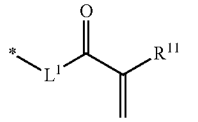

Formula (f)

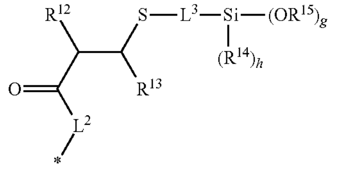

wherein in Formula (e) or Formula (f), 8-4-1) * represents a binding site, 8-4-2) $R^{11}$ is hydrogen or methyl, 8-4-3) $R^{12}$ to $R^{15}$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-4-4) $L^1$ to $L^3$ are each independently a single bond; a fluorenylene group; $C_{2-30}$ alkylene; $C_{6-30}$ arylene; a $C_{2-30}$ heterocyclic ring; $C_{1-30}$ alkoxylene, $C_{2-30}$ alkyleneoxy; $C_{6-30}$ aryloxy; or $C_{2-30}$ polyethyleneoxy, 8-4-5) g and h are each independently an integer from 0 to 3; with the proviso that g+h=3, and 9) the R', R", $X^2$, $L^1$ to $L^3$, $R^1$ to $R^{10}$, and $R^{12}$ to $R^{15}$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

When the R', R", $X^2$, $L^1$ to $L^3$, $R^1$ to $R^{10}$, and $R^{12}$ to $R^{15}$ are an aryl group, they may preferably be a $C_{6-30}$ aryl group, and more preferably a $C_{6-18}$ aryl group (e.g., phenyl, biphenyl, naphthyl, terphenyl, etc.).

When the R', R", $X^2$, $L^1$ to $L^3$, $R^1$ to $R^{10}$, and $R^{12}$ to $R^{15}$ are a heterocyclic group, they may preferably be a $C_{2-30}$ heterocyclic group, and more preferably a $C_{2-18}$ heterocyclic group (e.g., dibenzofuran, dibenzothiophene, naphthobenzothiophene, naphthobenzofuran, etc.).

When the R', R", $X^2$, $L^1$ to $L^3$, $R^1$ to $R^{10}$, and $R^{12}$ to $R^{15}$ are a fluorenyl group, they may preferably be 9,9-dimethyl-9H-fluorene, a 9,9-diphenyl-9H-fluorenyl group, 9,9'-spirobifluorene, etc.

When the $L^1$ to $L^3$ are an arylene group, they may preferably be a $C_{6-30}$ arylene group, and more preferably a $C_{6-18}$ arylene group (e.g., phenyl, biphenyl, naphthyl, terphenyl, etc.).

When the R', R", $X^2$, $L^1$ to $L^3$, $R^1$ to $R^{10}$, and $R^{12}$ to $R^{15}$ are an alkyl group, they may preferably be a $C_{1-10}$ alkyl group (e.g., methyl, t-butyl, etc.).

When the R', R", $X^2$, $L^1$ to $L^3$, $R^1$ to $R^{10}$, and $R^{12}$ to $R^{15}$ are an alkoxyl group, they may preferably be a $C_{1-20}$ alkoxyl group, and more preferably a $C_{1-10}$ alkoxyl group (e.g., methoxy, t-butoxy, etc.).

The ring formed by binding to one another among the neighboring groups of the R', R", $X^2$, $L^1$ to $L^3$, $R^1$ to $R^{10}$, and $R^{12}$ to $R^{15}$ may be a $C_{6-60}$ aromatic ring group; a fluorenyl group; a $C_{2-60}$ heterocyclic group including at least one heteroatom among O, N, S, Si, and P; or a $C_{3-60}$ aliphatic ring group, and for example, when an aromatic ring is formed by a mutual binding between the neighboring groups, preferably a $C_{6-20}$ aromatic ring, and more preferably a $C_{6-14}$ aromatic ring (e.g., benzene, naphthalene, phenanthrene, etc.) may be formed.

The ratio of Formula (e) and Formula (f) in the polymer chain of the resin including the repeating unit represented by Formula (1) above is preferably 2:0 to 1:1, and most preferably 1.5:0.5. When the ratio of Formula (f) is higher than the ratio of Formula (e), a residue may be generated due to the too high adhesion, and the amount of outgas generated may also be significantly increased, and when the ratio of Formula (e) to Formula (f) is 1.5:0.5, the resolution of the pattern is the best and the amount of outgas can be satisfied.

The ratio of Formula (c) and Formula (d) in the polymer chain of the resin including the repeating unit represented by Formula (1) above is preferably 1:9 to 9:1, and most preferably 8:2 to 2:8. In the case of a resin in which the structure represented by Formula (c) and the structure represented by Formula (d) are mixed in the polymer chain in the same ratio as above, its compatibility with other components in the black photosensitive resin composition is improved, the residue generated becomes less and the resolution becomes excellent, compared to when a resin containing only the structure represented by Formula (c) above or a resin containing only the structure represented by Formula (d) above is used in forming a pattern.

The weight average molecular weight of the resin including the repeating unit represented by Formula (1) above may be 1,000 g/mol to 100,000 g/mol, preferably 1,000 to 50,000 g/mol, and more preferably 1,000 g/mol to 30,000 g/mol. When the weight average molecular weight of the resin is within the above range, the pattern can be well formed without a residue in preparing the pattern layer, there is no loss of film thickness during development, and a good pattern can be obtained.

The resin including the repeating unit represented by Formula (1) above may be included in an amount of 1 wt % to 50 wt %, more preferably 5 wt % to 45 wt % based on the total amount of the black photosensitive resin composition. When the resin is included within the above range, excellent sensitivity, developability, and adhesion (an adherent property) can be obtained.

The black photosensitive resin composition may further include an acrylic resin in addition to the resin including the repeating unit represented by Formula (1) above. The acrylic resin is a copolymer of a first ethylenically unsaturated monomer and a second ethylenically unsaturated monomer copolymerizable therewith, and is a resin including one or more acrylic repeating units. The acrylic resin may be a copolymer of ethylenically unsaturated monomers including 2 to 10 types of acrylates, methacrylates, styrene, maleimide, maleic acid, maleic anhydride, etc. and the weight average molecular weight may be 5,000 g/mol to 30,000 g/mol.

The sum of the resin including the repeating unit represented by Formula (1) above and the acrylic resin may be included in an amount of 1 wt % to 50 wt %, more preferably 5 wt % to 45 wt % based on the total amount of the black photosensitive resin composition. When the sum of the resin including the repeating unit represented by Formula (1) above and the acrylic resin is included within the above range, excellent sensitivity, developability, and adhesion (an adherent property) can be obtained.

(2) Reactive Unsaturated Compound

The photosensitive composition for forming a light shielding layer of an organic light emitting display device according to an embodiment of the present disclosure includes a reactive unsaturated compound that can be cross-linked by radicals in the step of light exposure.

Since the reactive unsaturated compound has an ethylenically unsaturated double bond, it is possible to form a pattern having excellent heat resistance, light resistance, and chemical resistance by causing sufficient polymerization during exposure to light in the pattern forming process.

Specific examples of the reactive unsaturated compound may be ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, dipentaerythritol pentaacrylate, dipentaerythritol hexaacrylate, bisphenol A epoxy acrylate, ethylene glycol monomethyl ether acrylate, trimethylolpropane triacrylate, tripentaerythritol octaacrylate, etc.

Examples of commercially available products of the reactive unsaturated compound are as follows.

Examples of the bifunctional ester of (meth)acrylic acid may include Aronix M-210, M-240, M-6200, etc. (Toa Kosei Kagaku Kogyo Co., Ltd.), KAYARAD HDDA, HX-220, R-604, etc. (Nippon Kayaku Co., Ltd.), and V-260, V-312, V-335 HP, etc. (Osaka Yuki Kagaku Kogyo Co., Ltd.).

Examples of the trifunctional ester of (meth)acrylic acid include M-309, M-400, M-405, M-450, M-7100, M-8030, M-8060, etc. (Toa Kosei Kagaku Kogyo Co., Ltd.), KAYARAD TMPTA, DPCA-20, DPCA-60, DPCA-120, etc. (Nippon Kayaku Co., Ltd.), and V-295, V-300, V-360, etc. (Osaka Yuki Kagaku Kogyo Co., Ltd.).

These products may be used alone or in combination of two or more.

The reactive unsaturated compound may be used after treating with an acid anhydride so as to provide improved developability. The reactive unsaturated compound may be included in an amount of 1 wt % to 50 wt %, for example, 5 wt % to 30 wt %, based on the total amount of the photosensitive composition. When the reactive unsaturated compound is included within the above range, sufficient curing occurs during exposure to light in the pattern forming process, thus obtaining excellent reliability, excellent heat resistance, light resistance, and chemical resistance of the pattern, and also excellent resolution and adhesion.

(3) Photoinitiator

The photosensitive composition for forming a light shielding layer of an organic light emitting display device according to an embodiment of the present disclosure may include the following photoinitiator, and as a photoinitiator, an oxime ester-based compound may be used alone or in combination of two or more.

The photoinitiator that can be used in combination with the oxime ester-based compound is a photoinitiator used in the photosensitive resin composition, and for example, an acetophenone-based compound, a benzophenone-based compound, a thioxanthone-based compound, a benzoin-based compound, a triazine-based compound, etc. may be used.

Examples of the oxime ester-based compound may include 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, 2-dimethylamino-2-(4-methylbenzyl)-1-(4-morpholin-4-yl-phenyl)-butan-1-one, 1-(4-phenylsulfanylphenyl)-butane-1,2-dione2-oxime-O-benzoate, 1-(4-phenylsulfanylphenyl)-octan-1,2-dione2-oxime-O-benzoate, 1-(4-phenylsulfanylphenyl)-octan-1-one oxime-O-acetate and 1-(4-phenylsulfanylphenyl)-butan-1-one oxime-O-acetate, 1-(4-methylsulfanyl-phenyl)-butan-1-one oxime-O-acetate, hydroxyimino-(4-methylsulfanyl-phenyl)-acetate ethyl ester-O-acetate, hydroxyimino-(4-methylsulfanyl-phenyl)-acetate ethyl ester-O-benzoate, etc.

Examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, etc.

Examples of the benzophenone-based compound may include benzophenone, benzoyl benzoate, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, etc.

Examples of the thioxanthone-based compound may include thioxanthone, 2-chlorthioxanthone, 2-methylthioxanthone, isopropyl thioxanthone, 2,4-diethyl thioxanthone, 2,4-diisopropyl thioxanthone, 2-chlorothioxanthone, etc.

Examples of the benzoin-based compound may include benzoin, benzoin methyl ether, benzoin ethyl ether, benzoin isopropyl ether, benzoin isobutyl ether, benzyldimethyl ketal, etc.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine; 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-trichloromethyl(piperonyl)-6-triazine, 2-4-trichloromethyl(4'-methoxystyryl)-6-triazine, etc.

As the photoinitiator, a carbazole-based compound, a diketone-based compound, a sulfonium borate-based compound, a diazo-based compound, an imidazole-based compound, or a non-imidazole-based compound may be used in addition to the compounds described above.

As the photoinitiator, which is a radical polymerization initiator, a peroxide-based compound, an azobis-based compound, etc. may be used.

Examples of the peroxide-based compound may include ketone peroxides (e.g., methyl ethyl ketone peroxide, methyl isobutyl ketone peroxide, cyclohexanone peroxide, methylcyclohexanone peroxide, acetylacetone peroxide, etc.); diacyl peroxides (e.g., isobutyryl peroxide, 2,4-dichlorobenzoyl peroxide, o-methylbenzoyl peroxide, bis-3,5,5-trimethylhexanoyl peroxide, etc.); hydroperoxides (e.g., 2,4,4,-trimethylpentyl-2-hydroperoxide, diisopropylbenzene hydroperoxide, cumene hydroperoxide, t-butyl hydroperoxide, etc.); dialkyl peroxides (e.g., dicumyl peroxide, 2,5-dimethyl-2,5-di(t-butylperoxy)hexane, 1,3-bis(t-butyloxy-isopropyl)benzene, t-butylperoxyvalerate n-butyl ester, etc.); alkyl peresters (e.g., 2,4,4-trimethylpentyl peroxyphenoxyacetate, α-cumyl peroxyneodecanoate, t-butyl peroxybenzoate, di-t-butyl peroxytrimethyl adipate, etc.); percarbonates (e.g., di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyaryl carbonate, etc.), etc.

Examples of the azobis-based compound may include 1,1'-azobiscyclohexan-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis (isobutylnitrile), 4,4'-azobis(4-cyanovaleric acid), etc.

The photoinitiator may be used together with a photosensitizer that causes a chemical reaction by absorbing light to enter an excited state and then transferring the energy. Examples of the photosensitizer may include tetraethylene glycol bis-3-mercaptopropionate, pentaerythritol tetrakis-3-mercaptopropionate, dipentaerythritol tetrakis-3-mercaptopropionate, etc.

The photoinitiator may be included in an amount of 0.01 wt % to 10 wt %, for example, 0.1 wt % to 5 wt %, based on the total amount of the photosensitive resin composition. When the photoinitiator is included within the above range, it is possible to obtain excellent reliability due to sufficient curing that occurs during exposure to light in the pattern forming process, thereby obtaining excellent heat resistance, light resistance, and chemical resistance of the pattern, and also obtaining excellent resolution and adhesion, and being capable of preventing a decrease in transmittance due to an unreacted initiator.

(4) Black Colorant

The photosensitive composition for forming a light shielding layer of an organic light emitting display device according to an embodiment of the present disclosure the present disclosure includes a black colorant which includes one or more selected from the group consisting of black organic pigments, pseudo-blackening mixed-color organic pigments, and black inorganic pigments.

Examples of the black organic pigment may include, for example, lactam black, perylene black, cyanine black, aniline black, etc., but is not limited thereto.

Examples of the pseudo-blackening mixed-color organic pigments may include those which have become similarly blackened by mixing at least two or more pigments selected from red, blue, green, violet, yellow, cyanine, magenta, etc., but are also not limited thereto.

The red, blue, green, purple, yellow, cyanine, magenta, etc. pigments described above may be used without limitation as long as they are commonly used in the art. For example, those compounds classified as a pigment in the color index may be used, and known dyes may be further included.

As the black inorganic pigment, carbon black, chromium oxide, iron oxide, titanium black, etc. may be used.

For the black organic pigment, pseudo-blackening mixed-color organic pigment, and black inorganic pigment, two or more kinds may appropriately be selected and used, but are not limited thereto.

Preferably, carbon black may be used in terms of light blocking properties, surface smoothness, dispersion stability, compatibility with resins, etc.

If necessary, carbon black whose surface is coated with a resin may be used for electrical insulation. Since the resin-coated carbon black has lower conductivity than the resin-uncoated carbon black, it has an advantage in that it is possible to impart an excellent electrical insulation property when forming a light shielding layer.

The photosensitive resin composition according to the present disclosure includes, as a colorant, one or more selected from the group consisting of a black organic pigment, a pseudo-blackening mixed-color organic pigment, and a black inorganic pigment; therefore, the photosensitive resin composition has an advantage in that it can prepare a light shielding layer that can prevent mixing of colors of each pixel or prevent reflection of external light caused by a lower electrode.

In another embodiment of the present disclosure, the black colorant may include a black inorganic pigment and a black organic pigment. In this case, there is an advantage that high optical density can be imparted.

In still another embodiment of the present disclosure, the colorant may include a pseudo-blackening mixed-color organic pigment including a blue pigment.

The blue pigment may specifically include compounds classified as a pigment in the color index (published by the Society of Dyers and Colourists), and more specifically, although the pigments of the following color index (C.I.) numbers may be included, but is not necessarily limited to thereto.

For example, the blue colorant is C.I. Pigment Blue 15:3, 15:4, 15:6, 16, 21, 28, 60, 64, 76, and one or more blue pigments selected from the group consisting of combinations thereof may be included.

It is preferable from the aspect of the effect of suppressing the external light reflection that the blue colorant include one or more selected from the group consisting of, among them, C.I. Pigment Blue 15:3, C.I. Pigment Blue 15:4, C.I. Pigment Blue 15:6, and C.I. Pigment Blue 16.

The black colorant may be used alone or together with a dispersant to disperse each pigment constituting the black colorant. Specifically, the black colorant may be used alone; each pigment may be used after surface treatment with a dispersant; or may be used after adding a dispersant together with the pigment during preparation of the composition.

As the dispersant, a nonionic dispersant, an anionic dispersant, a cationic dispersant, etc. may be used. Specific examples of the dispersant may include polyalkylene glycol and an ester thereof, polyoxyalkylene, a polyhydric alcohol ester alkylene oxide adduct, an alcohol alkylene oxide adduct, a sulfonic acid ester, a sulfonic acid salt, a carboxylic acid ester, a carboxylic acid salt, an alkylamide alkylene oxide adduct, alkyl amine, etc., and these may be used alone or in combination of two or more.

Examples of commercially available products of the dispersant include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, etc., by BYK; EFKA-47, EFKA-47EA, EFKA-48, EFKA-49, EFKA-100, EFKA-400, EFKA-450, etc. by BASF; and Solsperse 5000, Solsperse 12000, Solsperse 13240, Solsperse 13940, Solsperse 17000, Solsperse 20000, Solsperse 24000GR, Solsperse 27000, Solsperse 28000, etc. by Zeneka; or PB711, PB821, etc. by Ajinomoto.

The dispersant may be included in an amount of 0.1 wt % to 15 wt % based on the total amount of the black photosensitive resin composition. When the dispersant is included within the above range, the dispersibility of the black photosensitive resin composition is excellent, and thus, its stability, developability, and patternability are excellent in preparing the light blocking layer.

The pigment may be used after pretreatment using a water-soluble inorganic salt and a wetting agent. When the pigment is pretreated as described above and used, the average particle size of the pigment can be refined.

The pretreatment may be performed through the step of kneading the pigment with a water-soluble inorganic salt and a wetting agent, and the step of filtering and washing the pigment obtained in the kneading step.

The kneading may be performed at a temperature of 40° C. to 100° C., and the filtration and washing may be performed by filtration after washing the inorganic salt with water, etc.

Examples of the water-soluble inorganic salt may include sodium chloride, potassium chloride, etc., but are not limited thereto.

The wetting agent serves as a medium through which the pigment and the water-soluble inorganic salt are uniformly mixed and the pigment can easily be pulverized, and examples of the wetting agent may include alkylene glycol monoalkyl ethers (e.g., ethylene glycol monoethyl ether, propylene glycol monomethyl ether, diethylene glycol monomethyl ether, etc.); and alcohols (e.g., ethanol, isopropanol, butanol, hexanol, cyclohexanol, ethylene glycol, diethylene glycol, polyethylene glycol, glycerin polyethylene glycol, etc.), and these may be used alone or in combination of two or more.

The pigment that has undergone the kneading step may have an average particle diameter of 5 nm to 200 nm, for example 5 nm to 150 nm. When the average particle diameter of the pigment is within the above range, the stability in the pigment dispersion is excellent and there is no risk of decreasing pattern resolution.

Specifically, the pigment may be used in the form of a pigment dispersion including the dispersant and a solvent such as PGMEA, and the pigment dispersion may include a solid pigment, a dispersant, and a solvent. The solid pigment may be included in an amount of 15 wt % to 40 wt %, for example, 20 wt % to 30 wt %, based on the total amount of the pigment dispersion.

The black colorant may be included in an amount of 1 wt % to 40 wt %, for example, 1 wt % to 35 wt %, based on the total amount of the black photosensitive resin composition. When the black colorant is included within the above range, the black realization effect and developing performance become excellent.

(5) Hollow Silica Particle

The photosensitive composition for forming a light shielding layer of an organic light emitting display device according to an embodiment of the present disclosure includes a hollow silica particle. The hollow silica particle is a silica particle having a cavity inside the particle.

As in the hollow silica particle, silica particles including gas in the particles have high dispersibility; therefore, the pattern linearity of a cured film (a light shielding layer) formed by curing the photosensitive composition of the present disclosure becomes good. Additionally, the refractive index of a light shielding layer including the hollow silica particles can be lowered by way of using silica particles containing gas in the particles.

The hollow silica particle may have an average particle diameter of 30 nm to 450 nm, and preferably have an average particle diameter of 50 nm to 400 nm. When the average particle diameter of the hollow silica particle is included in the above range, the hollow silica particle itself has high mechanical strength; therefore, it is not easily damaged even if a cavity is included in the particle, which is preferable. Additionally, when the average particle diameter of the hollow silica particle has a size within the above range, aggregation of hollow silica particles does not occur and their dispersion stability becomes excellent, and hollow silica particles may be uniformly present in the light shielding layer. Therefore, a deviation in reflectance does not occur in a light shielding layer and is thus preferable. Additionally, when forming a light shielding layer pattern, the effect of hollow silica particles exposed on the surface of the pattern is little; therefore, the pattern resolution becomes excellent.

The average particle diameter of the hollow silica particle can be obtained by randomly selecting 100 particles, measuring the lengths of the major axis and the minor axis of the particles, and averaging these. Additionally, the average particle diameter of the hollow silica particle can be measured by the Cumulant method using a dynamic light scattering particle size distribution analyzer "Particle Size Analyzer FPAR-1000" (manufactured by Otsuka Electronics Co., Ltd.).

Additionally, it is preferable that the refractive index of the hollow silica particles be in the range of 1.10 to 1.41, and more preferably 1.10 to 1.35. The refractive index of a light shielding layer can be made lower than that of a light shielding film including only general silica particles by way of using the hollow silica particles, which have a low refractive index compared to the refractive index of general silica particles (1.45 to 1.47).

The refractive index of the hollow silica particles can be obtained from a transparent mixture obtained by mixing the silica particles processed into a powder form with a standard refractive index liquid having a known refractive index. In this case, the refractive index of the standard refractive liquid of the mixed solution is referred to as the refractive index of the hollow silica particle. Additionally, the refractive index of the hollow silica particles can be measured using an Abbe refractometer.

Additionally, the hollow silica particle can adjust the ratio of internal cavities (hereinafter referred to as porosity). Since the refractive index of the hollow silica particles varies depending on the size of the particle diameter, it is easy to adjust the refractive index of a light shielding layer. The porosity refers to the ratio of the void within a particle to the void occupied by particle.

As for the hollow silica particle, the refractive index can be lowered as it has a higher porosity; therefore, the porosity of the hollow silica particle is preferably 20 vol % or more, preferably 20 vol % to 95 vol %, more preferably 25 vol % to 90 vol %, still more preferably 30 vol % to 90 vol %, and particularly preferably 35 vol % to 90 vol %. When the porosity is within the above range, a light shielding film having a desired refractive index can easily be obtained. Additionally, since reflection caused by a difference in refractive index between the transparent substrate and the light shielding film can be suppressed, reflection can be suppressed even without separately providing an anti-reflection film, etc. on the substrate.

The porosity of the hollow silica particles can be determined using a transmission electron microscope. Since the hollow part of a hollow silica particle has a low density and the contrast of the hollow part becomes low in a transmission electron micrograph, the outer part and the hollow part of the hollow silica particle can be identified. From the micrograph, the longest and shortest diameters of a hollow silica particle are measured first and the average value is used as the diameter of the particle, and the volume V1 is obtained assuming that the particle shape is spherical. Next, the longest and shortest diameters of the cavity of the particle are measured and the average value is used as the diameter of the cavity, and the volume V2 is obtained assuming that the shape of the cavity is spherical. The porosity can be expressed as the ratio of volume V2 to volume V1.

The shape of the hollow silica particle is not particularly limited as long as it has a desired porosity. It may be a spherical shape or an elliptical shape. The shape of the hollow silica particle used in the present disclosure is preferably spherical.

The hollow silica particle preferably has a sphericity of 1.05 to 1.5. When the sphericity of a hollow silica particle is within the above range, the shape of the particle approaches a true sphere. Therefore, it can be uniformly dispersed in a light shielding layer with a thin film thickness, and it is possible to form a light shielding layer in which the hollow silica particles are not exposed to the outside from the film surface while maintaining the flatness of the surface of the light shielding layer. Accordingly, a light shielding layer having a low refractive index and sufficient strength can be obtained.

The sphericity of the hollow silica particle can be obtained from the ratio of the longest diameter to the shortest diameter of the particle (an average value of 100 random silica particles). In particular, the longest and shortest diameters of a hollow silica particle are values obtained by photographing a silica particle with a transmission electron microscope and measuring the longest and shortest diameters of a hollow silica particle from the obtained micrograph.

The hollow silica particle may be crystalline or amorphous, may be monodispersed particles, or may be aggregated particles as long as they satisfy a predetermined particle size.

The specific surface area of the hollow silica particle is preferably 10 $m^2/g$ to 2,000 $m^2/g$, more preferably 20 $m^2/g$ to 1,800 $m^2/g$, and most preferably 50 $m^2/g$ to 1,500 $m^2/g$.

The hollow silica particles may be mixed with the black colorant, dispersant, resin, organic solvent, or prepared as a dispersion alone without the black colorant, and the black photosensitive resin composition of the present disclosure may include the dispersion.

In the dispersion, in order to stabilize the dispersion or to increase compatibility or a binding property with an alkali soluble resin and a reactive unsaturated compound component, the hollow silica particles may be subjected to physical surface treatment (e.g., plasma discharge treatment and corona discharge treatment) or chemical surface treatment with a surfactant, a coupling agent, etc. The use of a coupling agent is preferred. As the coupling agent, an alkoxy metal compound (e.g., a titanium coupling agent or silane coupling agent) is preferably used. Among them, the silane coupling treatment is effective. That is, the surface of the hollow silica particle may be treated with an inorganic or organic substance and dissolved or dispersed in an organic solvent.

As a hollow silica particle, a commercially available product may preferably be used.

Examples of the hollow silica particle that can be used may include Sluria series of JGC C&C products (e.g., isopropanol (IPA) dispersion or 4-methyl-2-pentanone (MIBK) dispersion) and the OSCAL series; Snowtex series of Nissan Chemical Industries, Ltd. Products (e.g., IPA dispersion, ethylene glycol dispersion, methyl ethyl ketone (MEK) dispersion, dimethylacetamide dispersion, MIBK dispersion, propylene glycol monomethyl acetate dispersion, propylene glycol monomethyl ether dispersion, methanol dispersion, ethyl acetate dispersion, butyl acetate dispersion, xylene-n-butanol dispersion, or toluene dispersion); SiliNax of Nittetsu Mining Co., Ltd. products; PL series of Fuso Chemical Co., Ltd. products (e.g., IPA dispersion); Aerosil series of EVONIK products (e.g., propylene glycol acetate dispersion, ethylene glycol dispersion, or MIBK dispersion); and the AERODISP series of EVONIK products.

As for the hollow silica particle, one type of particle may be used alone, or two or more types of particles may be used in combination. When two or more types of particles are used together, for example, hollow silica particles and porous silica particles may be used together.

The hollow silica particles are included in an amount of 20 wt % or less (excluding a solvent) based on the total amount of the black photosensitive resin composition.

For example, the hollow silica particles may be included in an amount of 0.1 wt % to 20 wt % based on the total amount of the black photosensitive resin composition. When the hollow silica particles are included in an amount of 0.1 wt % to 20 wt % based on the total amount of the black photosensitive resin composition, there is an effect of lowering the refractive index of a film or pattern to be formed.

When the hollow silica particles are included in an amount of less than 0.1 wt % based on the total amount of the photosensitive composition, the effect of lowering the refractive index does not occur sufficiently, whereas when the hollow silica particles are included in an amount of 20 wt % or more based on the total amount of the photosensitive composition, it may be undesirable because there is a problem in that developability is deteriorated and residues are generated or resolution is lowered during the patterning of the black photosensitive resin composition.

(6) Solvent

In an embodiment of the present disclosure, as the solvent, materials may be used which are compatible with the alkali soluble resin, the reactive unsaturated compound, the photoinitiator, the black colorant, and the hollow silica particle but do not react.

Examples of the solvent include alcohols (e.g., methanol, ethanol, etc.); ethers (e.g., dichloroethyl ether, n-butyl ether, diisoamyl ether, methylphenyl ether, tetrahydrofuran, etc.); glycol ethers (e.g., ethylene glycol monomethyl ether, ethylene glycol monoethyl ether, etc.); cellosolve acetates (e.g., methyl cellosolve acetate, ethyl cellosolve acetate, diethyl cellosolve acetate, etc.); carbitols (e.g., methylethyl carbitol, diethyl carbitol, diethylene glycol monomethyl ether, diethylene glycol monoethyl ether, diethylene glycol dimethyl ether, diethylene glycol methyl ethyl ether, diethylene glycol diethyl ether, etc.); propylene glycol alkyl ether acetates (e.g., propylene glycol methyl ether acetate, propylene glycol propyl ether acetate, etc.); aromatic hydrocarbons (e.g., toluene, xylene, etc.); ketones (e.g., methyl ethyl ketone, cyclohexanone, 4-hydroxy-4-methyl-2-pentanone, methyl-n-propyl ketone, methyl-n-butyl ketone, methyl-n-amyl ketone, 2-heptanone, etc.); saturated aliphatic monocarboxylic acid alkyl esters (e.g., ethyl acetate, n-butyl acetate, isobutyl acetate, etc.); lactic acid esters (e.g., methyl lactate and ethyl lactate); oxyacetic acid alkyl esters (e.g., methyloxyacetate, ethyloxyacetate, butyl oxyacetate, etc.); alkoxy acetate alkyl esters (e.g., methoxy methyl acetate, methoxy ethyl acetate, methoxy butyl acetate, ethoxy methyl acetate, ethoxy ethyl acetate, etc.); 3-oxypropionic acid alkyl esters (e.g., 3-oxy methyl propionate, 3-oxy ethyl propionate, etc.); 3-alkoxy propionic acid alkyl esters (e.g., 3-methoxy methyl propionate, 3-methoxy ethyl propionate, 3-ethoxy ethyl propionate, 3-ethoxy methyl propionate, etc.); 2-oxypropionic acid alkyl esters (e.g., methyl 2-oxypropionate, ethyl 2-oxypropionate, propyl 2-oxypropionate, etc.); 2-alkoxy propionic acid alkyl esters (e.g., 2-methoxy methyl propionate, 2-methoxy ethyl propionate, 2-ethoxy ethyl propionate, 2-ethoxy methyl propionate, etc.); 2-oxy-2-methyl propionic acid esters (e.g., 2-oxy-2-methyl methyl propionate, 2-oxy-2-methyl ethyl propionate, etc.); monooxy monocarboxylic acid alkyl esters of 2-alkoxy-2-methyl propionic acid alkyls (e.g., 2-methoxy-2-methyl methyl propionate, 2-ethoxy-2-methyl ethyl propionate, etc.); esters (e.g., 2-hydroxyethyl propionate, 2-hydroxy-2-methyl ethyl propionate, ethyl hydroxyacetate, 2-hydroxy-3-methyl methyl butanoate, etc.); ketonic acid esters (e.g., ethyl pyruvate, etc.), etc.

Further, high boiling point solvents such as N-methylformamide, N,N-dimethylformamide, N-methylformanilad, N-methylacetamide, N,N-dimethylacetamide, N-methylpyrrolidone, dimethyl sulfoxide, benzylethyl ether, dihexyl ether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate may also be used.

Among the solvents above, considering compatibility and reactivity, the following solvents may be used: glycol ethers (e.g., ethylene glycol monoethyl ether, etc.); ethylene glycol alkyl ether acetates (e.g., ethyl cellosolve acetate, etc.); esters (e.g., ethyl 2-hydroxypropionate, etc.); carbitols (e.g., diethylene glycol monomethyl ether, etc.); and propylene glycol alkyl ether acetates (e.g., propylene glycol methyl ether acetate, propylene glycol propyl ether acetate, etc.).

The solvent may be included as a balance based on the total amount of the photosensitive resin composition, and specifically in the amount of 50 wt % to 90 wt %. When the solvent is included within the above range, the photosensitive resin composition has an appropriate viscosity, and thus the processability becomes excellent in preparing the pattern layer.

(7) Other Additives

In order to prevent stains or spots during application, to improve leveling performance, and to prevent the generation of undeveloped residues, the photosensitive composition may further include other additives such as malonic acid; 3-amino-1,2-propanediol; a silane-based coupling agent including a vinyl group or (meth)acryloxy group; a leveling agent; a fluorine-based surfactant; and a radical polymerization initiator.

Additionally, the photosensitive composition may further include an additive such as an epoxy compound so as to improve adhesion with a substrate.

Examples of the epoxy compound may include a phenol novolac epoxy compound, a tetramethyl biphenyl epoxy compound, a bisphenol A type epoxy compound, an alicyclic epoxy compound, or a combination thereof.

The content of the additives can easily be adjusted according to desired physical properties.

Still another embodiment of the present disclosure may provide an organic light emitting display device.

Hereinafter, an organic light emitting display device will be described referring to FIG. 1. The organic light emitting display device according to an embodiment of the present disclosure is characterized in that it includes a substrate (1), a TFT layer (2) on the substrate, a flattening layer (3) on the TFT layer, an organic light emitting device layer on the flattening layer, a sealing layer (8) disposed on the organic light emitting diode layer, a touch panel (9) disposed on a sealing layer, and a color filter disposed on the touch panel, and one or more among the flattening layer, the organic light emitting device layer, the sealing layer, the touch panel, and the color filter include a pattern or film formed of the photosensitive composition of the present disclosure.

More specifically, the organic light emitting display device, which is a light shielding layer, is characterized in that it includes a flattening layer, a pixel defining layer, and a color separation unit, and it is characterized in that one or more among the flattening layer, the pixel defining layer, and the color separation unit include a pattern or film formed of the photosensitive composition of the present disclosure. The pattern or film is formed of the photosensitive composition, which includes an alkali soluble resin containing the repeating unit represented by Formula (1), hollow silica, and a black pigment as essential components.

The substrate (1) may be a flexible substrate. The substrate may be made of a plastic material having excellent heat resistance and durability, such as such polyimide (PI), polyethylene terephthalate (PET), polyethylene naphtalate (PEN), polycarbonate (PC), polyarylate (PAR), polyetherimide (PEI), and polyethersulfone (PES).

However, the present disclosure is not limited thereto, and various flexible materials (e.g., metal foil or thin glass) may be used.

Meanwhile, the substrate may be a rigid a substrate, and in particular, the substrate may be made of a glass material containing $SiO_2$ as a main component.

In the case of a bottom emission type in which the image is implemented in the direction of a substrate, the substrate must be formed of a transparent material. However, in the case of a top emission type in which the image is implemented in the opposite direction of a substrate, the substrate does not necessarily have to be formed of a transparent material. In this case, the substrate can be formed of a metal. When the substrate is formed of a metal, the substrate may include one or more selected from the group consisting of carbon, iron, chromium, manganese, nickel, titanium, molybdenum, and stainless steel (SUS), but is not limited thereto.

A TFT layer (2) may be disposed on the substrate. As used herein, the term TFT layer collectively refers to a thin film transistor (TFT) array for driving an organic light emitting device, and it refers to a driving part for displaying an image. FIG. 1 shows only an organic light emitting device and a driving thin film transistor for driving the organic light emitting device, which are only for convenience of description and the present disclosure is not limited to what is shown, and it is apparent to those skilled in the art that a plurality of thin film transistors, storage capacitors, and various wirings may be further included.

The TFT layer may be protected by being covered with a flattening layer (3). The flattening layer may include an inorganic insulating layer and/or an organic insulating layer. Examples of the inorganic insulating film that can be used for the flattening layer may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), lead zirconate-titanate (PZT), etc.

Additionally, examples of the organic insulating film that can be used for the flattening layer may include common general-purpose polymers (PMMA, PS), polymer derivatives having phenolic groups, acrylic polymers, imide-based polymers, arylether-based polymers, amide-based polymers, fluorine-based polymers, p-xylene-based polymers, vinyl alcohol-based polymers, and blends thereof.

Meanwhile, the flattening layer may have a composite stacked structure of an inorganic insulating film and an organic insulating film.

Additionally, the flattening layer may include the photosensitive composition of the present disclosure. Matters regarding the photosensitive composition of the present disclosure are the same as those according to an embodiment of the present disclosure, and will thus be omitted herein. When the flattening layer is formed of the photosensitive composition of the present disclosure, the refractive index of the flattening layer is reduced by the hollow silica particles included in the photosensitive resin composition of the present disclosure, which can lower the reflectance of external light, and is thus very desirable.

Additionally, a flattening layer pattern with high resolution can be formed by an alkali soluble resin of the present disclosure, which has excellent compatibility with the hollow silica particles, there is an effect of reducing outgas generation, which is preferable because the reliability of the pattern is improved. Additionally, the photosensitive resin composition of the present disclosure has the effect of improving the visibility of an organic light emitting display device by absorbing light incident from the outside by including a black colorant, and is thus more preferable.

An organic light emitting device layer may be formed on the upper part of the flattening layer. The organic light emitting device layer may include a pixel electrode (4) formed on the flattening layer, a counter electrode (7) disposed to face the pixel electrode, and an organic material layer (6) interposed therebetween. When a voltage is applied between the pixel electrode and the counter electrode, the organic material layer can emit light.

The organic material layer may emit red light, green light, blue light, white light, etc. The organic light emitting display device may further include blue, green, and red color filters so as to express color images when the organic material layer emits white light, and so as to increase color purity and light efficiency when the organic material layer emits red light, green light, and blue light.

The organic light emitting display device may be classified into a bottom emission type, a top emission type, a dual emission type, etc. according to the emission direction. In an organic light emitting display device of the bottom emission type, the pixel electrode is provided as a light transmitting electrode and the counter electrode is provided as a reflective electrode. In an organic light emitting display device of the top emission type, the pixel electrode is provided as a reflective electrode and the counter electrode is provided as a transflective electrode.

In the present disclosure, the top emission type in which the organic light emitting device emits light in the direction of a sealing layer will be described.

The pixel electrode may be a reflective electrode. The pixel electrode may include a stacked structure of a reflective layer and a transparent or semi-transparent electrode layer having a high work function. The reflective layer may include Ag, Mg, Al, Pt, Pd, Au, Ni, Nd, Ir, Cr, or an alloy thereof. The transparent or semi-transparent electrode layer may include at least one material selected from among transparent conductive oxide materials, such as indium tin oxide (ITO), indium zinc oxide (IZO), zinc oxide (ZnO), indium oxide ($In_2O_3$; indium oxide), indium gallium oxide (IGO), aluminum zinc oxide (AZO), etc.

The pixel electrode may be formed by patterning in an island shape corresponding to each pixel.

Additionally, the pixel electrode may function as an anode electrode.

Meanwhile, a pixel defining layer (5) may be disposed on the pixel electrode so as to cover the edge of the pixel electrode and include a predetermined opening part that exposes the central part of the pixel electrode. An organic material layer including an organic light emitting layer that emits light may be disposed on the area defined by the opening part. The region on which an organic material layer is disposed may be defined as a light emitting region.

Meanwhile, when the light emitting region is formed within the opening part of the pixel defining layer, a region protruding by the pixel defining layer is disposed between the light emitting regions, and this region may be defined as a non-light emitting area because an organic light emitting layer is not formed in this protruding area. Matters regarding the photosensitive composition of the present disclosure are the same as those according to an embodiment of the present disclosure, and will thus be omitted herein.

When forming a pixel defining film with the photosensitive composition of the present disclosure, the refractive index of a pixel defining layer is reduced by the hollow silica particles included in the photosensitive composition of the present disclosure, and thus the reflectance for external light can be lowered, which is highly desirable. Additionally, a pixel defining layer pattern with high resolution can be formed by an alkali soluble resin of the present disclosure, which has excellent compatibility with the hollow silica particles, and there is an effect of reducing outgas generation, which is preferable because the reliability of the pattern is improved.

Additionally, the photosensitive resin composition of the present disclosure has the effect of improving the visibility of an organic light emitting display device by absorbing light incident from the outside by including a black colorant, and is thus more preferable.

The counter electrode may be formed as a transmissive electrode. The counter electrode may be a semi-transmissive layer in which a metal having a small work function (e.g., Li, Ca, LiF/Ca, LiF/Al, Al, Mg, Ag, etc.) is thinly formed. In order to compensate for the high resistance problem of the thin metal semi-transmissive layer, a transparent conductive layer made of a transparent conductive oxide may be stacked on the metal semi-transmissive layer.

The counter electrode may be formed over the entire surface of a substrate in the form of a common electrode.

Additionally, such a counter electrode may function as a cathode electrode.

The polarities of the pixel electrode and the counter electrode as described above may be opposite to each other.

The organic material layer includes an organic light emitting layer that emits light, and the organic light emitting layer may use a low-molecular weight organic material or high-molecular weight organic material. When the organic light emitting layer is a low-molecular-weight organic layer formed of a low-molecular organic material, a hole transport layer (HTL), a hole injection layer (HIL), etc. may be disposed in the direction of the pixel electrode around the organic light emitting layer, whereas an electron transport layer (ETL), an electron injection layer (EIL), etc. may be disposed in the direction of a counter electrode. Certainly, other functional layers than the hole injection layer, hole transport layer, electron transport layer, and electron injection layer may be stacked.

A sealing layer (8) may be disposed on the organic light emitting device layer so as to cover the organic light emitting device layer. The organic light emitting device included in the organic light emitting device layer is composed of an organic material and thus can easily be deteriorated by external moisture or oxygen. Therefore, in order to protect the organic light emitting device, the organic light emitting device layer must be sealed. The sealing layer is a means for sealing the organic light emitting device layer, and may have a structure in which a plurality of inorganic layers and a plurality of organic layers are alternately stacked.

As for the organic light emitting display device according to this embodiment, it is preferable to form a sealing layer with a thin film in which a plurality of inorganic films and a plurality of organic films are alternately stacked instead of a sealing substrate, and flexibility and thinning of the organic light emitting display device can easily be realized by using a thin film as a sealing means.

The sealing layer may include a plurality of inorganic layers and a plurality of organic layers. The inorganic layers and the organic layers may be alternately stacked on each other.

The inorganic layers may be formed of a metal oxide, a metal nitride, a metal carbide, or a combination thereof. For example, the inorganic layers may be made of aluminum oxide, silicon oxide, or silicon nitride. According to another embodiment, the inorganic layers may include a stacked structure of a plurality of inorganic insulating layers. The inorganic layers may perform the functions of preventing the penetration of external moisture and/or oxygen, etc. into the organic light emitting device layer.

The organic layers may be high molecular weight organic compounds. For example, the organic layers may include any one of epoxy, acrylate, and urethane acrylate. The organic layers may perform the functions of relieving internal stress of the inorganic layers or compensating for defects and flattening the inorganic layers.

The order of stacking the inorganic and organic layers constituting the sealing layer is not limited. An organic or inorganic layer may be stacked on the organic light emitting device layer, and the uppermost layer of the sealing layer may be an organic or inorganic layer.

A touch panel (9) may be formed on the sealing layer. The touch panel may include a first touch electrode formed on the sealing layer, a second touch electrode disposed to face the first touch electrode, and an insulating layer interposed therebetween.

The first touch electrode and the second touch electrode may be formed in a grid pattern or specific pattern shape. The first touch electrode may be formed to be in contact with an upper part of the sealing layer, and an inorganic layer may be additionally provided between the sealing layer and the first touch electrode.

The first touch electrode and the second touch electrode may be formed of indium tin oxide (ITO) or of a metal mesh and may preferably be formed of a metal mesh.

The metal mesh is an electrode prepared by printing an opaque metal (copper, silver, gold, aluminum, etc.) in the form of a grid with a thickness of 1 μm to 7 μm. Due to the use of a metal with high conductivity, the metal mesh has the advantages in that it has a low resistance value thus having a fast touch response speed, it enables easy realization of a large screen, and is cheaper than ITO film in cost. In addition, the metal mesh electrode has excellent durability against repeated bending compared to the ITO electrode, thus being suitable for use as a touch panel electrode for a foldable display.

The touch panel is preferably a capacitive type touch panel that detects the position by recognizing the part where the amount of current has changed and calculating the size using the capacitance of the human body when the user touches the touch panel.

It should be apparent to those skilled in the art that the organic light emitting display device of the present disclosure is not limited to those illustrated, and Control IC (which converts the analog signal transmitted from the touch panel into a digital signal and controls the coordinate values, etc. needed to determine the coordinates of the touch area), optical clear adhesive, a flexible printed circuit board (FPCB), in which conductive and signal line patterns are formed to thereby transmit various signals to electronic components, etc.), and other various kinds of electronic components and various kinds of wirings may be further included.

A color filter may be formed on the touch panel. The color filter may be prepared in advance and provided in an organic light emitting display device, or a process of forming the color filter directly on a touch panel may be performed.

The color filter may be positioned on an upper part of the touch panel, and it may include a color unit (10), which is aligned in a vertical direction with reference to the light emitting area of the organic light emitting device layer; and a color separation unit (11), which is vertically aligned with the non-emission area and separates the color unit.

The photosensitive composition of the present disclosure may be included in the color separation unit and absorbs and blocks external light incident to the organic light emitting display device thereby improving outdoor visibility. When forming the color separation unit of a color filter using the photosensitive composition of the present disclosure, the refractive index of the color separation unit is reduced by the hollow silica particles included in the photosensitive composition of the present disclosure, and thus the reflectance for external light can be lowered, which is highly desirable.

Additionally, a color separation unit with high resolution can be formed by an alkali soluble resin of the present disclosure, which has excellent compatibility with the hollow silica particles, and there is an effect of reducing outgas generation, which is preferable because the reliability of the pattern is improved.

Additionally, the photosensitive composition of the present disclosure is more preferable because it has the effect of improving the visibility of an organic light emitting display device by absorbing light incident from the outside by including a black colorant.

Additionally, since the photosensitive composition of the present disclosure has high photosensitivity, the pattern is sufficiently cured even if the post-heat treatment process is performed at 100° C. or less during the photopatterning process, and thus the heat resistance and chemical resistance of the color separation unit pattern are secured; therefore, a color separation unit can be formed without thermal damage to the organic material layer of the organic light emitting device layer.

It is apparent to those skilled in the art that, among the structures of the above-described organic light emitting display device, several functional layers having specific purposes and functions may be additionally disposed between each layer, and the organic light emitting display device of the present disclosure is not limited to the structures and drawings described above.

Hereinafter, Synthesis Examples and Examples of the present disclosure will be described in detail; however, these Synthesis Examples and Examples of the present disclosure are not limited thereto.

Synthesis Example 1 (Synthesis of Hollow Silica)

Synthesis Example 1-1

(Synthesis of Hollow Silica 1)

To a 3,000 mL 3-neck round-bottom flask equipped with a distillation tube, 1,600 g (20 mol) of cyclohexane (Sigma Aldrich), 560 g (0.93 mol) of polyoxyethylene tert-octylphenyl ether (Sigma Aldrich), 360 g (3.57 mol) of 1-hexanol (Sigma Aldrich), and 88 g of water were added, and the mixture was stirred at room temperature for 30 minutes. Then, 5.8 g (0.03 mol) of tetraethylorthosilicate (Sigma Aldrich) was added thereto and the mixture was stirred for additional 2 hours. 45 g of aqueous ammonia (29 wt % of an aqueous solution, Daejung Chemicals) was added thereto, and the mixture was stirred for 10 hours, and 1 g (5.6 mmol) of (3-aminopropyl)trimethoxysilane (Sigma Aldrich), which was diluted in 6 g of ethanol, was added thereto dropwise for 30 minutes. After stirring at room temperature for an additional 6 hours, 1 L of ethanol was added thereto, and 3 g of hollow silica nanoparticles (diameter: 50 nm) was obtained using a centrifuge.

Synthesis Example 1-2

(Synthesis of Hollow Silica 2)

To a 250 mL 3-neck round-bottom flask equipped with a distillation tube, 1.5 g of poly(vinyl pyrrolidone) (Mw: 40,000, Sigma Aldrich), 10 g (0.096 mol) of styrene (Sigma Aldrich), and 0.5 g (0.003 mol) of azobisisobutyronitrile (Sigma Aldrich), 5 g (0.278 mol) of purified water, 45 g (0.977 mol) of ethanol were added, and nitrogen was added thereto while stirring the mixture at 350 RPM. After raising the temperature therein to 70° C. and maintaining the temperature for 3 hours, 0.6 g of [2-(methacryloyloxy)ethyl] trimethylammonium chloride (75 wt % in water, Sigma Aldrich) was added thereto and the mixture was stirred for 3 hours. Then, after cooling to the resultant to 50° C., 4 mL of aqueous ammonia (25 wt %, Sigma Aldrich) was added thereto, and 10 g (0.048 mol) of tetraethylorthosilicate (Sigma Aldrich) was additionally added thereto. The resultant was stirred for an additional 2 hours, cooled, and 100 mL of ethanol was added thereto. The resultant was subjected to centrifugation to thereby obtain 13 g of particles, in which a silica shell is filled with internal polystyrene and which have a diameter of 400 nm. The particles were calcined at 800° C. for 1 hour using a furnace (Revodix Inc.) to remove the polystyrene inside the particles, and thereby 2 g of hollow silica nanoparticles (diameter: 400 nm) was obtained.

Synthesis Example 1-3

(Synthesis of Hollow Silica 3)

2 g of hollow silica nanoparticles (diameter: 1 μm) was obtained in the same manner as in Synthesis Example 1-2, except for reducing the amount of poly(vinyl pyrrolidone) (Mw: 40,000, Sigma Aldrich) from 1.5 g to 0.5 g and reducing the stirring speed from 350 RPM to 250 RPM.

Synthesis Example 2 (Synthesis of Alkali Soluble Resin)

Synthesis Example 2-1

(Preparation of Compound 2-1)

80 g (0.228 mol) of 9,9'-bisphenol fluorene (Sigma Sigma Aldrich), 42.67 g (0.461 mol of glycidyl chloride (Sigma Aldrich), 191 g (1.38 mol) of anhydrous potassium carbonate, and 600 mL of dimethylformamide were added into a 1,500 mL 3-neck round-bottom flask equipped with a distillation tube, and the temperature was raised to 80° C. and reacted for 4 hours. Then, the temperature was lowered to 25° C. and the reaction solution was filtered and the filtrate was added dropwise to 1,000 mL of water while stirring, and the precipitated powder was filtered, washed with water, and dried under reduced pressure at 40° C. to obtain 100 g (216 mmol) of Compound 2-1. The obtained powder was subjected to purity analysis by HPLC and was shown to have a purity of 98%.

Compound 2-1

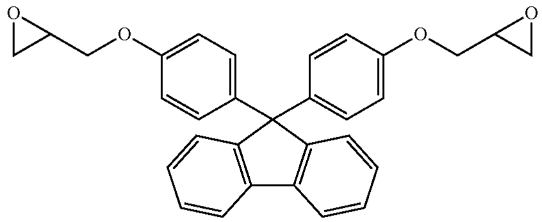

Synthesis Example 2-2

(Preparation of Monomers 1-1 to 1-3)

25 g (54 mmol) of Compound 2-1 obtained in Synthesis Example 2-1, 7.9 g (0.11 mol of acrylic acid (Daejung Chemicals & Metals), 0.03 g (0.16 mmol) of benzyltriethylammonium chloride (Daejung Chemicals & Metals), 0.01 g (0.05 mmol) of hydroquinone (Daejung Chemicals & Metals), and 52 g of toluene (Sigma Aldrich) were added into a 300 mL 3-neck round-bottom flask equipped with a distillation tube, and the mixture was stirred at 110° C. for 6 hours. After completion of the reaction, toluene was removed by distillation under reduced pressure to obtain a product. After a glass column (diameter: 220 mm) was filled with 500 g of silica gel 60 (230-400 mesh, Merck), 20 g of the product was loaded thereinto, and separation was performed using 10 L of a solvent in which hexane and ethyl acetate were mixed in a 4:1 volume ratio and thereby Monomers 1-1 to 1-3 were separated.

Monomer 1-1

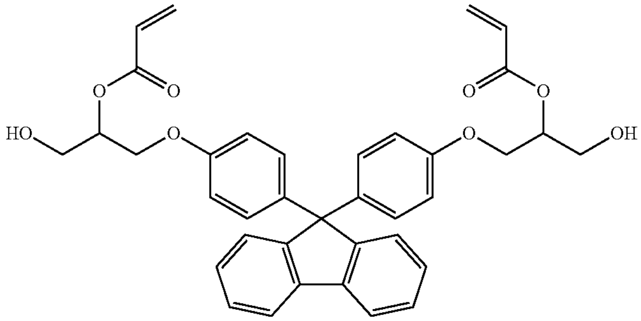

Monomer 1-2

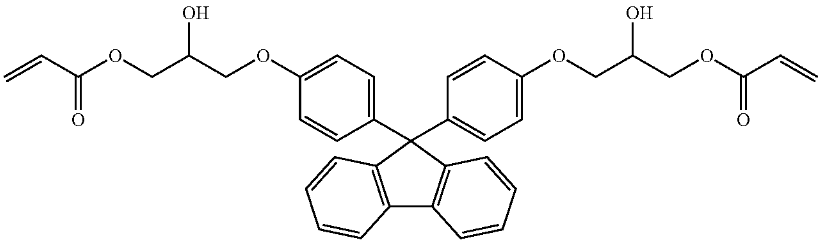

Monomer 1-3

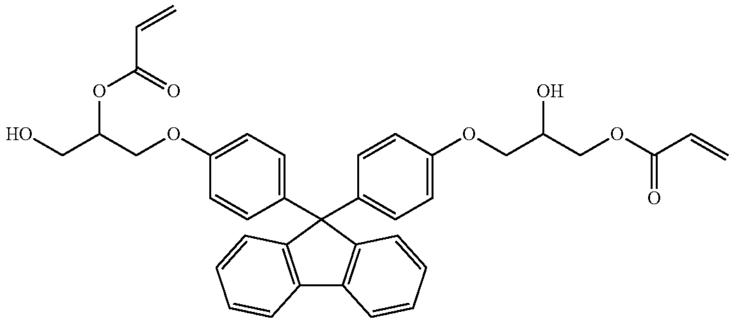

Synthesis Examples 2-3 to 2-9

(Preparation of Polymers 1-1 to 1-7)

Monomer 1-1, Monomer 1-2, and Monomer 1-3 obtained in Synthesis Example 2-2 were added to a total amount of 5 g (8.2 mmol) into a 50 mL 3-neck round-bottom flask equipped with a distillation tube, as shown in Table 1 below, and then, 0.005 g (0.03 mmol) of benzyltriethyl ammonium chloride (Daejung Chemicals & Metals), 0.001 g (0.01 mmol) of hydroquinone (Daejung Chemicals & Metals), and 14 g of propylene glycol methyl ether acetate (Sigma Aldrich) were added into a 3-neck round-bottom flask equipped with a distillation tube, and 1.21 g (4 mmol) of biphenyltetracarboxylic dianhydride (Mitsubishi Gas) and 0.38 g (2 mmol) of tetrahydrophthalic acid (Sigma Aldrich) were additionally added thereto and the mixture was stirred at 110° C. for 6 hours. After completion of the reaction, the reaction solution was recovered to obtain Polymers 1-1 to 1-7, in which the repeating units with the structures of Monomers 1-1, 1-2, and 1-3 were mixed, in the form of a solution containing 45% solids. The synthesized polymers were analyzed for their weight average molecular weight (Mw) using gel permeation chromatography (Agilent).

TABLE 1

| | Synthesis Example 2-3 (Polymer 1-1) | Synthesis Example 2-4 (Polymer 1-2) | Synthesis Example 2-5 (Polymer 1-3) | Synthesis Example 2-6 (Polymer 1-4) | Synthesis Example 2-7 (Polymer 1-5) | Synthesis Example 2-8 (Polymer 1-6) | Synthesis Example 2-9 (Polymer 1-7) |
|---|---|---|---|---|---|---|---|
| Monomer 1-1 | 3 g (4.95 mmol) | 1 g (1.65 mmol) | 1 g (1.65 mmol) | 4.25 g (7.01 mmol) | 0.25 g (0.41 mmol) | 5 g (8.24 mmol) | 0 g |
| Monomer 1-2 | 1 g (1.65 mmol) | 3 g (4.95 mmol) | 1 g (1.65 mmol) | 0.25 g (0.41 mmol) | 4.25 g (7.01 mmol) | 0 g | 5 g (8.24 mmol) |
| Monomer 1-3 | 1 g (1.65 mmol) | 1 g (1.65 mmol) | 3 g (4.95 mmol) | 0.5 g (0.83 mmol) | 0.5 g (0.83 mmol) | 0 g | 0 g |

TABLE 1-continued

| | Synthesis Example 2-3 (Polymer 1-1) | Synthesis Example 2-4 (Polymer 1-2) | Synthesis Example 2-5 (Polymer 1-3) | Synthesis Example 2-6 (Polymer 1-4) | Synthesis Example 2-7 (Polymer 1-5) | Synthesis Example 2-8 (Polymer 1-6) | Synthesis Example 2-9 (Polymer 1-7) |
|---|---|---|---|---|---|---|---|
| Weight Average Molecular Weight | 4,800 g/mol | 4,200 g/mol | 4,600 g/mol | 4,400 g/mol | 4,100 g/mol | 5,200 g/mol | 3,300 g/mol |

Synthesis Example 2-10

(Preparation of Compound 3-1)

20 g (0.147 mol) of trichloro silane (Gelest) and 17.51 g (0.147 mol) of 6-chloro-1-hexene (Aldrich) were dissolved in 200 mL of ethyl acetate in a 3-neck round-bottom flask equipped with a distillation tube to which cooling water was connected, and then 0.02 g of a platinum(0)-1,3-divinyl-1,1,3,3-tetramethyldisiloxane complex solution (2 wt % in xylene/Aldrich) was added, and the temperature was raised to 75° C. while adding nitrogen thereto and the mixture was allowed to react for 5 hours, and the solution was filtered with a 0.1 μm Teflon membrane to remove the platinum catalyst. Thereafter, 15.6 g (0.487 mol) of methanol was added dropwise at room temperature for 30 minutes, and the temperature was again raised to 50° C. and the mixture was allowed to react for additional 2 hours, and the reaction solution was distilled under reduced pressure to remove the solvent. 24 g (0.1 mol) of the thus-obtained 6-chlorohexyltrimethoxysilane, 8 g (0.15 mol) of sodium methoxide (Aldrich), and 187 mL (0.15 mol) of a hydrogen sulfide THF solution (0.8 M concentration), and 100 mL of methanol were added into an autoclave, and the mixture was allowed to react at 100° C. for 2 hours. After cooling the reaction solution, 100 mL of hydrogen chloride in methanol (1.25 M concentration) was added thereto dropwise at room temperature for 30 minutes, the resulting salt was filtered off, and then distilled under reduced pressure to obtain Compound 3-1 (23 g).

Compound 3-1

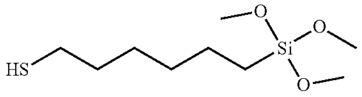

Synthesis Example 2-11

(Preparation of Compound 3-2)
(Preparation of Compound 3-2)

The preparation was performed in the same manner as in Synthesis Example 2-10 above, except that 23.7 g (0.147 mol) of 9-chloro-1-nonene (AK Scientific) was used instead of 6-chloro-1-hexene.

Compound 3-2

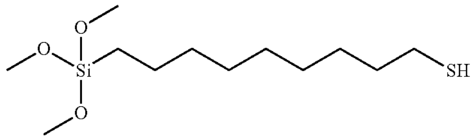

Synthesis Example 2-12

(Preparation of Compound 3-3)

The preparation was performed in the same manner as in Synthesis Example 2-10, except that 30 g (0.147 mol) of 12-chloro-1-dodecene (Atomax Chemicals) was used instead of 6-chloro-1-hexene.

Compound 3-3

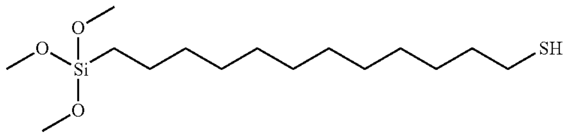

Synthesis Example 2-13

(Preparation of Compound 3-4)

The preparation was performed in the same manner as in Synthesis Example 2-10, except that 22.4 g (0.487 mol) of ethanol (Aldrich) was used instead of methanol which was added after removing platinum.

Compound 3-4

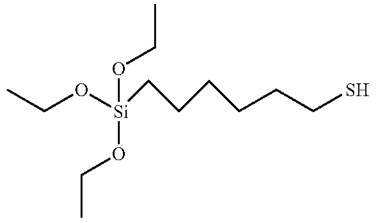

Synthesis Example 2-14

(Preparation of Compound 3-5)

The preparation was performed in the same manner as in Synthesis Example 2-10, except that 36 g (0.487 mol) of 1-butanol (Aldrich) was used instead of methanol which was added after removing platinum.

Compound 3-5

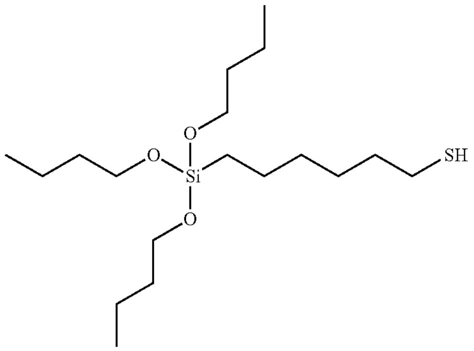

Synthesis Example 2-15

(Preparation of Compound 3-6)

The preparation was performed in the same manner as in Synthesis Example 2-10, except that 18 g (0.147 mol) of dichloromethylsilane was used instead of trichlorosilane.

Compound 3-6

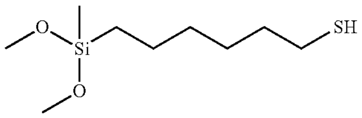

Synthesis Example 2-16

(Preparation of Binder 1-1)

6.36 g (34 mmol) of KBM 803 [3-(trimethoxysilyl)-1-propanethiol] (Shinetsu), which is the same as Compound 3-7, was added to 360 g of the solution of Polymer 1-1 prepared in Synthesis Example 2-3, and the temperature was raised to 60° C. and the mixture was stirred for 4 hours to obtain Binder 1-1, which is an alkali soluble resin where a silane group like Compound 3-7 is substituted.

Compound 3-7

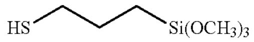

Synthesis Examples 2-17 to 2-22

(Preparation of Binders 1-2 to 1-7)

Binders 1-2 to 1-7, which are alkali soluble resins where a silane group is substituted, were prepared in the same manner as in Synthesis Example 2-16, except that the solutions of Polymers 1-2 to 1-7 described in Table 1 were used instead of the solution of Polymer 1-1.

TABLE 2

| | Synthesis Example 2-16 (Binder 1-1) | Synthesis Example 2-17 (Binder 1-2) | Synthesis Example 2-18 (Binder 1-3) | Synthesis Example 2-19 (Binder 1-4) | Synthesis Example 2-20 (Binder 1-5) | Synthesis Example 2-21 (Binder 1-6) | Synthesis Example 2-22 (Binder 1-7) |
|---|---|---|---|---|---|---|---|
| Polymer Backbone | Polymer 1-1 | Polymer 1-2 | Polymer 1-3 | Polymer 1-4 | Polymer 1-5 | Polymer 1-6 | Polymer 1-7 |
| Silane Group | Compound 3-7 | Compound 3-7 | Compound 3-7 | Compound 3-7 | Compound 3-7 | Compound 3-7 | Compound 3-7 |
| Solids | 34% | 34% | 34% | 34% | 34% | 34% | 34% |
| Weight Average Molecular Weight | 4,880 g/mol | 4,250 g/mol | 4,680 g/mol | 4,430 g/mol | 4,140 g/mol | 5,270 g/mol | 3,320 g/mol |

Synthesis Example 2-23

(Preparation of Binder 2-1)

8.1 g (34 mmol) of 6-(trimethoxysilyl)-1-hexanethiol (Compound 3-1) was added to 360 g of the solution of Polymer 1-1 prepared in Synthesis Example 2-3, and the temperature was raised to 60° C., and the mixture was stirred for 4 hours to obtain Binder 2-1, which is an alkali soluble resin where a silane group like Compound 3-1 is substituted.

Synthesis Examples 2-24 to 2-29

(Preparation of Binders 2-2 to 2-7)

Binders 2-2 to 2-7, which are alkali soluble resins where a silane group is substituted, were prepared in the same manner as in Synthesis Example 23, except that the solutions of Polymers 1-2 to 1-7 described in Table 1 were used instead of the solution of Polymer 1-1.

TABLE 3

| | Synthesis Example 2-23 (Binder 2-1) | Synthesis Example 2-24 (Binder 2-2) | Synthesis Example 2-25 (Binder 2-3) | Synthesis Example 2-26 (Binder 2-4) | Synthesis Example 2-27 (Binder 2-5) | Synthesis Example 2-28 (Binder 2-6) | Synthesis Example 2-29 (Binder 2-7) |
|---|---|---|---|---|---|---|---|
| Polymer Backbone | Polymer 1-1 | Polymer 1-2 | Polymer 1-3 | Polymer 1-4 | Polymer 1-5 | Polymer 1-6 | Polymer 1-7 |
| Silane Group | Compound 3-1 | Compound 3-1 | Compound 3-1 | Compound 3-1 | Compound 3-1 | Compound 3-1 | Compound 3-1 |
| Solids | 34% | 34% | 34% | 34% | 34% | 34% | 34% |
| Weight Average Molecular Weight | 4,900 g/mol | 4,280 g/mol | 4,690 g/mol | 4,470 g/mol | 4,160 g/mol | 5,290 g/mol | 3,360 g/mol |

Synthesis Example 2-30

(Preparation of Binder 3-1)

9.53 g (34 mmol) of 6-(triethoxysilyl)-1-hexanethiol (Compound 3-4) was added to 360 g of the solution of Polymer 1-1 prepared in Synthesis Example 3, and the temperature was raised to 60° C., and the mixture was stirred for 4 hours to obtain Binder 3-1, which is an alkali soluble resin where a silane group like Compound 3-4 is substituted.

Synthesis Examples 2-31 to 2-36

(Preparation of Binders 3-2 to 3-7)

Binders 3-2 to 3-7, which are alkali soluble resins where a silane group is substituted, were prepared in the same manner as in Synthesis Example 2-30, except that the solutions of Polymers 1-2 to 1-7 described in Table 1 were used instead of the solution of Polymer 1-1.

TABLE 4

| | Synthesis Example 2-30 (Binder 3-1) | Synthesis Example 2-31 (Binder 3-2) | Synthesis Example 2-32 (Binder 3-3) | Synthesis Example 2-33 (Binder 3-4) | Synthesis Example 2-34 (Binder 3-5) | Synthesis Example 2-35 (Binder 3-6) | Synthesis Example 2-36 (Binder 3-7) |
|---|---|---|---|---|---|---|---|
| Polymer backbone | Polymer 1-1 | Polymer 1-2 | Polymer 1-3 | Polymer 1-4 | Polymer 1-5 | Polymer 1-6 | Polymer 1-7 |
| Silane Group | Compound 3-4 | Compound 3-4 | Compound 3-4 | Compound 3-4 | Compound 3-4 | Compound 3-4 | Compound 3-4 |
| Solids | 34% | 34% | 34% | 34% | 34% | 34% | 34% |
| Weight Average Molecular Weight | 4,900 g/mol | 4,290 g/mol | 4,690 g/mol | 4,480 g/mol | 4,180 g/mol | 5,290 g/mol | 3,380 g/mol |

Synthesis Example 3 (Synthesis of Acryl Binder)

55 g of propylene glycol methyether acetate (Sigma Aldrich), 31.5 g (0.18 mol) of benzyl methacrylate (Sigma Aldrich), 2.25 g (0.01 mol) of azobisisobutyronitrile (Sigma Aldrich), 6.75 g (0.07 mol) of methyl methacrylate (Sigma Aldrich), and 6.75 g (0.08 mol) of methacrylic acid (Sigma Aldrich) were added into a 3-neck round-bottom flask equipped with a distillation tube, and the mixture was stirred at 80° C. for 3 hours to obtain a propylene glycol methyether acetate solution containing 30 wt % solids of acryl binder (Mw: 10,000).

Preparation Example 1 (Preparation of Black Pigment Dispersion)

15 g of Irgaphor Black S 0100 CF (black pigment/BASF), 8.5 g of Disperbyk 163 (BYK), and 6.5 g of SR-6100 (SMS), 70 g of propylene glycol methyl ether acetate, and 100 g of zirconia beads (diameter: 0.5 mm, Toray) were dispersed for 10 hours using a paint shaker (Asada) to obtain a dispersion.

Preparation Examples 2-1 to 2-6 (Preparation of Compositions of the Present Disclosure)

Compositions 1-1 to 1-6 containing the hollow silica particle of the present disclosure and the alkali soluble resin of the present disclosure were prepared according to the compositions (wt %) shown in Table 5 below.

TABLE 5

| | Preparation Example 2-1 (Composition 1-1) | Preparation Example 2-2 (Composition 1-2) | Preparation Example 2-3 (Composition 1-3) | Preparation Example 2-4 (Composition 1-4) | Preparation Example 2-5 (Composition 1-5) | Preparation Example 2-6 (Composition 1-6) |
|---|---|---|---|---|---|---|
| Black Pigment Dispersion | 30 | 30 | 30 | 30 | 30 | 30 |
| Hollow Silica 1 | 3 | 3 | 3 | — | — | — |
| Hollow Silica 2 | — | — | — | 3 | 3 | 3 |
| OXE-02 (BASF) | 0.5 | 0.5 | 0.5 | 0.5 | 0.5 | 0.5 |
| M600 (Miwon Specialty Chemical) | 7 | 7 | 7 | 7 | 7 | 7 |
| Binder 1-1 | 8 | — | — | 8 | — | — |
| Binder 1-2 | — | 8 | — | — | 8 | — |
| Binder 1-3 | — | — | 8 | — | — | 8 |
| Propylene Glycol Methyl Ether Acetate (Daicel) | 51.5 | 51.5 | 51.5 | 51.5 | 51.5 | 51.5 |

Preparation Examples 3-1 to 3-6 (Preparation of Comparative Compositions)

Compositions 2-1 to 2-6, which do not contain the hollow silica particle of the present disclosure or contain an alkali soluble resin different from the alkali soluble resin of the present disclosure, were prepared according to the compositions (wt %) shown in Table 6 below.

TABLE 6

| | Preparation Example 3-1 (Composition 2-1) | Preparation Example 3-2 (Composition 2-2) | Preparation Example 3-3 (Composition 2-3) | Preparation Example 3-4 (Composition 2-4) | Preparation Example 3-5 (Composition 2-5) | Preparation Example 3-6 (Composition 2-6) |
|---|---|---|---|---|---|---|
| Black Pigment Dispersion | 30 | 30 | 30 | 30 | 30 | 30 |
| Hollow Silica 1 | 3 | 3 | 3 | — | — | — |
| Hollow Silica 3 | — | — | — | 3 | 3 | 3 |
| OXE-02 (BASF) | 0.5 | 0.5 | 0.5 | 0.5 | 0.5 | 0.5 |
| M600 (Miwon Specialty Chemical) | 7 | 7 | 7 | 7 | 7 | 7 |
| Binder 1-6 | 8 | — | — | 8 | — | — |
| Binder 1-7 | — | 8 | — | — | 8 | — |
| Acryl Binder | — | — | 8 | — | — | 8 |
| Propylene Glycol Methyl Ether Acetate (Daicel) | 51.5 | 51.5 | 51.5 | 51.5 | 51.5 | 51.5 |

Examples (Evaluation of Optical Density, Reflectance, Resolution and Amount of Outgas Generation)

Example 1

The optical density, reflectance, resolution, and amount of outgas generation of the cured product formed of Composition 1-1 in Table 5 were evaluated by the following method, and the results are shown in Table 7 below.

1. Evaluation of Optical Density and Reflectance

Composition 1-1 above was spin-coated on a glass substrate, pre-baked at about 100° C. for 90 seconds, and applied to a thickness of about 1.2 μm. Then, after cooling at room temperature for 60 seconds, 30 mJ/cm$^2$ of ultraviolet ray was irradiated on the entire surface using an ultra-high pressure mercury lamp to induce a photocuring reaction of the photosensitive portion. The exposed substrate was developed in a 0.043% KOH aqueous solution at room temperature by a spray method, and then washed with a pure solvent for 60 seconds. Then, after drying at room temperature, the substrate was subjected to post-baking in a convection oven at 230° C. for 30 minutes to obtain an entire face of a specimen. After forming the specimen, the optical density was measured using X-rite equipment, and the reflectance was measured using CM-3700A (Konica Minolta) equipment, and the results are shown in Table 7 below.

2. Evaluation of Resolution

Composition 1-1 above was spin-coated on a glass substrate, pre-baked at about 100° C. for 90 seconds, and applied to a thickness of about 1.3 μm. Then, after cooling at room temperature for 60 seconds, 40 mJ/cm$^2$ of ultraviolet ray was irradiated on a mask, in which pattern sizes are split, using an ultra-high pressure mercury lamp to induce a photocuring reaction of the photosensitive portion. The exposed substrate was developed in a 0.043% KOH aqueous solution at room temperature by a spray method, and then washed with a pure solvent for 60 seconds. Then, after drying at room temperature, the substrate was subjected to post-baking in a convection oven at 230° C. for 30 minutes to obtain a patterned specimen. After forming the specimen, the optical density was measured using X-rite equipment, and the reflectance was measured using BX-51 (Olumpus) equipment, and the results are shown in Table 7 below.

3. Outgas Evaluation (Measurement of Amount of Outgas Generation)

Composition 1-1 above was spin-coated on a glass substrate, pre-baked at about 100° C. for 90 seconds, and applied to a thickness of about 1.2 μm. Then, after cooling at room temperature for 60 seconds, 30 $mJ/cm^2$ of ultraviolet ray was irradiated on the entire surface using an ultra-high pressure mercury lamp to induce a photocuring reaction of the photosensitive portion. The exposed substrate was developed in a 0.043% KOH aqueous solution at room temperature by a spray method, and then washed with a pure solvent for 60 seconds. Then, after drying at room temperature, the substrate was subjected to post-baking in a convection oven at 230° C. for 30 minutes to obtain an entire face of a specimen. The entire face of the specimen was cut into a total of 6 partial specimens with a size of 1 cm×3 cm. The outgas of the partial specimens was collected at 250° C. for 30 minutes using the JTD-505III (JAI). After measuring the specimens for toluene examination (100 ppm, 500 ppm, and 1,000 ppm) using the QP2020 GC/MS (Shimadzu), a calibration curve was prepared, and the amount of outgas collected was measured.

Examples 2 to 6

The optical density, reflectance, resolution, and amount of outgas generation of the cured product were evaluated in the same manner as in Example 1, except that Compositions 1-2 to 1-6 were used instead of Composition 1-1, and the results are listed in Table 7.

Comparative Examples 1 to 6

The optical density, reflectance, resolution, and amount of outgas generation of the cured product were evaluated in the same manner as in Example 1, except that Compositions 2-1 to 2-6 were used instead of Composition 1-1, and the results are listed in Table 7.

TABLE 7

| | Composition | Optical Density (/μm) | Reflectance (%) | Resolution (μm) | Amount of Outgas Generation (ppm) |
|---|---|---|---|---|---|
| Example 1 | Composition 1-1 | ◎ | ◎ | ◎ | 2.83 |
| Example 2 | Composition 1-2 | ◎ | ◎ | ◎ | 2.92 |
| Example 3 | Composition 1-3 | ◎ | ◎ | ◎ | 2.87 |
| Example 4 | Composition 1-4 | ◎ | ○ | ○ | 2.59 |
| Example 5 | Composition 1-5 | ○ | ○ | ◎ | 2.63 |
| Example 6 | Composition 1-6 | ◎ | ○ | ◎ | 2.67 |
| Comparative Example 1 | Composition 2-1 | ○ | ◎ | Δ | 3.56 |
| Comparative Example 2 | Composition 2-2 | ◎ | ○ | Δ | 3.65 |
| Comparative Example 3 | Composition 2-3 | ○ | Δ | Δ | 10.6 |
| Comparative Example 4 | Composition 2-4 | ○ | Δ | Δ | 3.74 |
| Comparative Example 5 | Composition 2-5 | Δ | ○ | Δ | 3.69 |
| Comparative Example 6 | Composition 2-6 | ○ | Δ | Δ | 11.2 |

Evaluation Criteria for Optical Density, Reflectance, and Resolution

Optical Density: ◎ (>4.5), ○ (4.5≥x>4.2), Δ (≤4.2)

Reflectance: ◎ (<5.5), ○ (5.9>x≥5.5), Δ (≥5.9)

Resolution: ◎ (<4), ○ (7>x≥4), Δ (≥7)

From Table 7 above, it was confirmed that the cured products prepared in Examples 1 to 6, where the hollow silica particle and alkali soluble resin of the present disclosure were used, showed higher optical density, lower reflectance, excellent resolution due to a smaller pattern size on the substrate, and a less amount of outgas generation compared to those prepared in Comparative Examples 1 to 6, where the alkali soluble resin of the present disclosure was not used.

That is, it can be seen from Table 7 above that the cured product formed of the photosensitive composition according to an embodiment of the present disclosure has an excellent light shielding property, a low reflection property, a low amount of outgas generation, and also excellent resolution.

The cured products of the present disclosure are not limited to the embodiments above, but may be prepared in a variety of different forms.

The above description is merely illustrative of the present disclosure, and those skilled in the art to which the present disclosure pertains will be able to make various modifications within a range that does not deviate from the essential characteristics of the present disclosure.

Therefore, the embodiments disclosed in this specification are for explanation purposes rather than limiting the present disclosure, and the spirit and scope of the present disclosure are not limited by these embodiments. The protection scope of the present disclosure should be interpreted by the claims, and all descriptions within the scope equivalent thereto should be construed as being included in the scope of the present disclosure.

What is claimed is:

1. A photosensitive composition for forming a light shielding layer of an organic light emitting display device, comprising:

(1) an alkali soluble resin comprising a repeating unit represented by Formula (1);

(2) a reactive unsaturated compound;

(3) a photoinitiator;

(4) a black colorant;

(5) a hollow silica particle; and (6) a solvent:

Formula (1)

Formula (1)

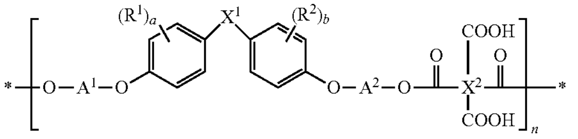

wherein in Formula (1) above,

1) * represents a part where a bond is connected by a repeating unit,

2) N is an integer of 2 to 200,000,

3) $R^1$ and $R^2$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 4) $R^1$ and $R^2$ each may form a ring with a neighboring group, 5) A and b are each independently an integer of 0 to 4, 6) $X^1$ is a single bond, O, CO, $SO_2$, CR'R", SIR'R", Formula (a), or Formula (b), wherein 6-1) R' and R" are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-2) R' and R" each may form a ring with a neighboring group, 6-3) where Formula (a)

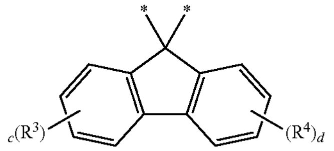

Formula

Formula (b)

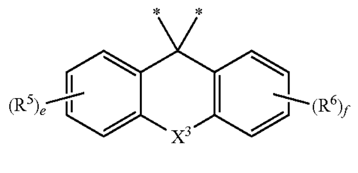

6-3-1) * represents a binding site, 6-3-2) $X^3$ is O, S, $SO_2$, or NR', 6-3-3) R' and $R^3$ to $R^6$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-3-4) $R^3$ to $R^6$ each may form a ring with a neighboring group, 6-3-5) c to f are each independently an integer of 0 to 4, 7) $X^2$ is a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8) $A^1$ and $A^2$ are each independently Formula (c) or Formula (d), in such cases, the repeating unit of Formula (1) wherein $A^1$ and $A^2$ are Formula (d) is a repeating unit 1-1;

the repeating unit of Formula (1) wherein $A^1$ and $A^2$ are Formula (c) is a repeating unit 1-2; and the repeating unit of Formula (1) wherein $A^1$ and $A^2$ are each differently Formula (c) or Formula (d) is a repeating unit 1-3:

Formula (c)

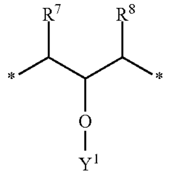

Formula (d)

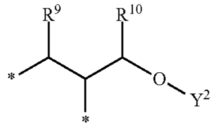

wherein in Formula (c) and Formula (d) above, 8-1) * represents a binding site, 8-2) $R^7$ to $R^{10}$* are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3) the ratio of Formula (c) and Formula (d) in the polymer chain of the resin comprising the repeating units 1-1 to 1-3 represented by Formula (1) above is 1:9 to 9:1, 8-4) $Y^1$ and $Y^2$ are each independently Formula (e) or Formula (f), Formula (e)

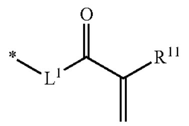

Formula (f)

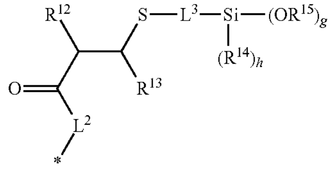

wherein in Formula (e) or Formula (f), 8-4-1) * represents a binding site, 8-4-2) $R^{11}$ is hydrogen or methyl, 8-4-3) $R^{12}$ to $R^{15}$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-4-4) $L^1$ to $L^3$ are each independently a single bond; a fluorenylene group; $C_{2-30}$ alkylene; $C_{6-30}$ arylene; a $C_{2-30}$ heterocyclic ring; $C_{1-30}$ alkoxylene, $C_{2-30}$ alkyleneoxy; $C_{6-30}$ aryloxy; or $C_{2-30}$ polyethyleneoxy, 8-4-5) g and h are each independently an integer from 0 to 3; with the proviso that g+h=3, and 9) The R', R", $X^2$, $L^1$ to $L^3$, $R^1$ to $R^{10}$, and $R^{12}$ to $R^{15}$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group comprising at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

2. The photosensitive composition of claim 1, wherein the size of the hollow silica particle is from 30 nm to 450 nm.

3. The photosensitive composition of claim 1, wherein the hollow silica particles are included in an amount of 0.1 wt % to 20 wt % based on the solid content.

4. The photosensitive composition of claim 1, wherein the refractive index of the hollow silica particle is 1.10 to 1.41.

5. The photosensitive composition of claim 1, wherein the porosity of the hollow silica particle is 20 vol % to 95 vol %.

6. The photosensitive composition of claim 1, wherein the sphericity of the hollow silica particle is 1.05 to 1.5.

7. The photosensitive composition of claim 1, wherein the specific surface area of the hollow silica particle is 10 $m^2/g$ to 2,000 $m^2/g$.

8. The photosensitive composition of claim 1, wherein the weight average molecular weight of the alkali soluble resin is 1,000 to 100,000.

9. The photosensitive composition of claim 1, wherein the alkali soluble resin is included in an amount of 1 wt % to 50 wt % based on the total amount of the photosensitive composition.

10. The photosensitive composition of claim 1, wherein the reactive unsaturated compound is included in an amount of 1 wt % to 50 wt % based on the total amount of the photosensitive composition.

11. The photosensitive composition of claim 1, wherein the photoinitiator is included in an amount of 0.01 wt % to 10 wt % based on the total amount of the photosensitive composition.

12. The photosensitive composition of claim 1, wherein the colorant comprises at least one of inorganic pigments and organic pigments.

13. The photosensitive composition of claim 1, wherein the colorant is included in an amount of 1 wt % to 40 wt % based on the total amount of the photosensitive composition.

14. The photosensitive composition of claim 1, wherein the colorant is pretreated using a dispersant; or a water-soluble inorganic salt and a wetting agent.

15. The photosensitive composition of claim 1, wherein the average particle diameter of the colorant is 5 nm to 200 nm.

16. A light shielding layer of an organic light emitting display device formed of the photosensitive composition according to claim 1.

17. An organic light emitting display device comprising the light shielding layer according to claim 16.

18. The organic light emitting display device of claim 17, wherein the light shielding layer is one or more selected from the group consisting of a flattening layer, a pixel defining layer, and a color separation unit.

19. An electronic device comprising the display device of claim 17 and a control unit for driving the display device.

* * * * *